(12) United States Patent
Huang et al.

(10) Patent No.: US 12,525,293 B2
(45) Date of Patent: Jan. 13, 2026

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Yajun Huang, Wuhan (CN); Chuan Yang, Wuhan (CN); Qian Gao, Wuhan (CN); Xin Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 733 days.

(21) Appl. No.: 17/864,032

(22) Filed: Jul. 13, 2022

(65) Prior Publication Data

US 2024/0021247 A1    Jan. 18, 2024

(51) Int. Cl.
| | |
|---|---|
| H01L 23/522 | (2006.01) |
| G11C 16/04 | (2006.01) |
| H01L 23/528 | (2006.01) |
| H10B 41/27 | (2023.01) |
| H10B 41/35 | (2023.01) |
| H10B 41/40 | (2023.01) |
| H10B 43/27 | (2023.01) |
| H10B 43/35 | (2023.01) |
| H10B 43/40 | (2023.01) |

(52) U.S. Cl.
CPC ...... *G11C 16/0483* (2013.01); *H01L 23/5226* (2013.01); *H01L 23/5283* (2013.01); *H10B 41/27* (2023.02); *H10B 41/35* (2023.02); *H10B 41/40* (2023.02); *H10B 43/27* (2023.02); *H10B 43/35* (2023.02); *H10B 43/40* (2023.02)

(58) Field of Classification Search
CPC ............. H01L 23/5226; H01L 23/5283; H01L 21/76816; H01L 21/76897; H01L 23/5386; G11C 16/0483; H10B 41/27; H10B 41/35; H10B 41/40; H10B 43/27; H10B 43/35; H10B 43/40; H10B 43/50
See application file for complete search history.

(56) References Cited

U.S. PATENT DOCUMENTS

| | | | |
|---|---|---|---|
| 11,424,184 B2 * | 8/2022 | Luo | H01L 23/5226 |
| 2008/0182367 A1 * | 7/2008 | Petti | H10B 20/25 |
| | | | 257/E27.081 |

(Continued)

FOREIGN PATENT DOCUMENTS

| | | |
|---|---|---|
| CN | 113906563 A | 1/2022 |
| CN | 114613749 A | 6/2022 |

(Continued)

*Primary Examiner* — Galina G Yushina
(74) *Attorney, Agent, or Firm* — BAYES PLLC

(57) ABSTRACT

In certain aspects, a three-dimensional (3D) memory device includes a stack structure including interleaved conductive layers and dielectric layers and having a core array region and a staircase region in a plan view, one or more channel structures each extending through the core array region of the stack structure, and one or more contact structures each extending through the stack structure, wherein each of the one or more contact structures includes a head portion and a body portion, and a width of the head portion of the respective contact structure is larger than that of the body portion of the respective contact structure.

20 Claims, 16 Drawing Sheets

(56) References Cited

U.S. PATENT DOCUMENTS

| | | | |
|---|---|---|---|
| 2017/0084626 A1* | 3/2017 | Kim | H01L 21/76831 |
| 2020/0286815 A1* | 9/2020 | Moriyama | H10B 43/27 |
| 2020/0328180 A1* | 10/2020 | Cheng | H01L 25/18 |
| 2020/0395376 A1* | 12/2020 | Huo | H10B 43/27 |
| 2021/0313240 A1* | 10/2021 | Tanamachi | H01L 23/53295 |
| 2022/0157847 A1 | 5/2022 | Zhang et al. | |

FOREIGN PATENT DOCUMENTS

| | | |
|---|---|---|
| TW | 201947706 A | 12/2019 |
| TW | 202114147 A | 4/2021 |
| TW | 202119554 | 5/2022 |
| TW | 202218131 A | 5/2022 |

\* cited by examiner

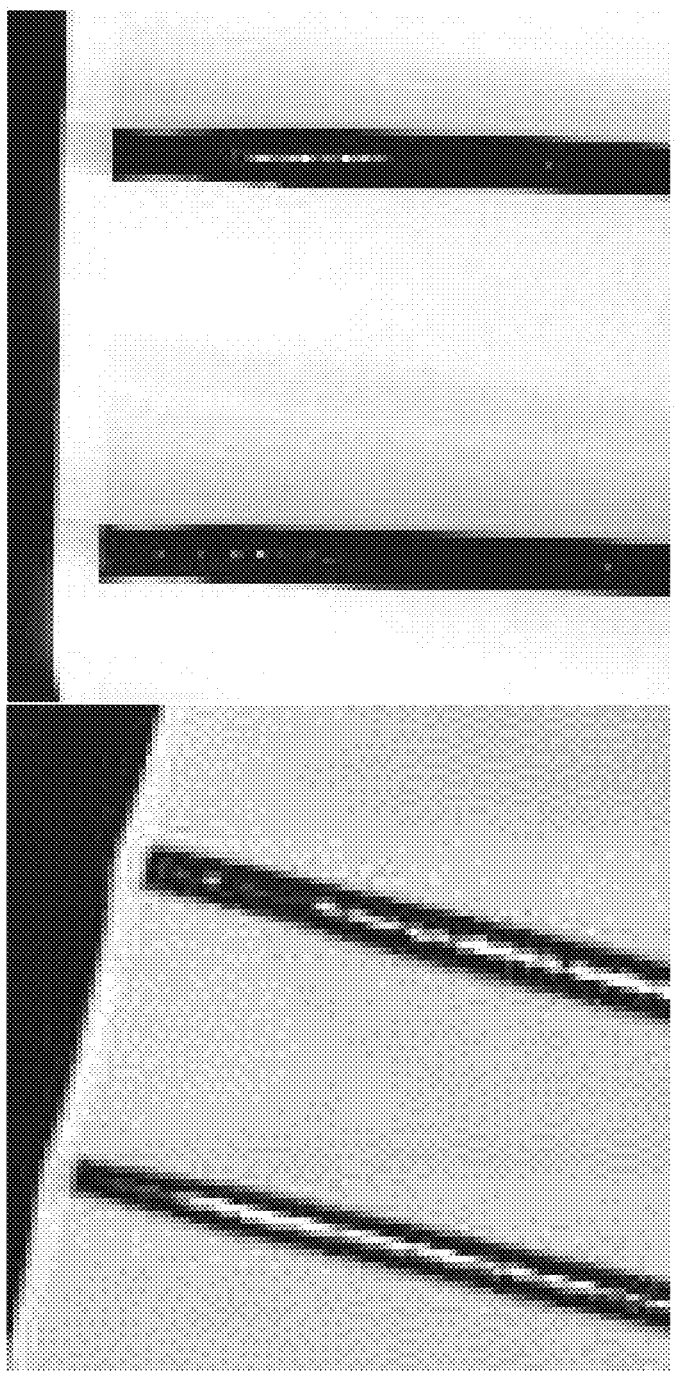
FIG. 4B
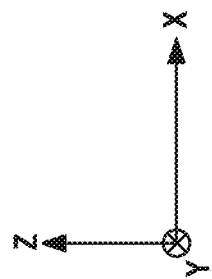

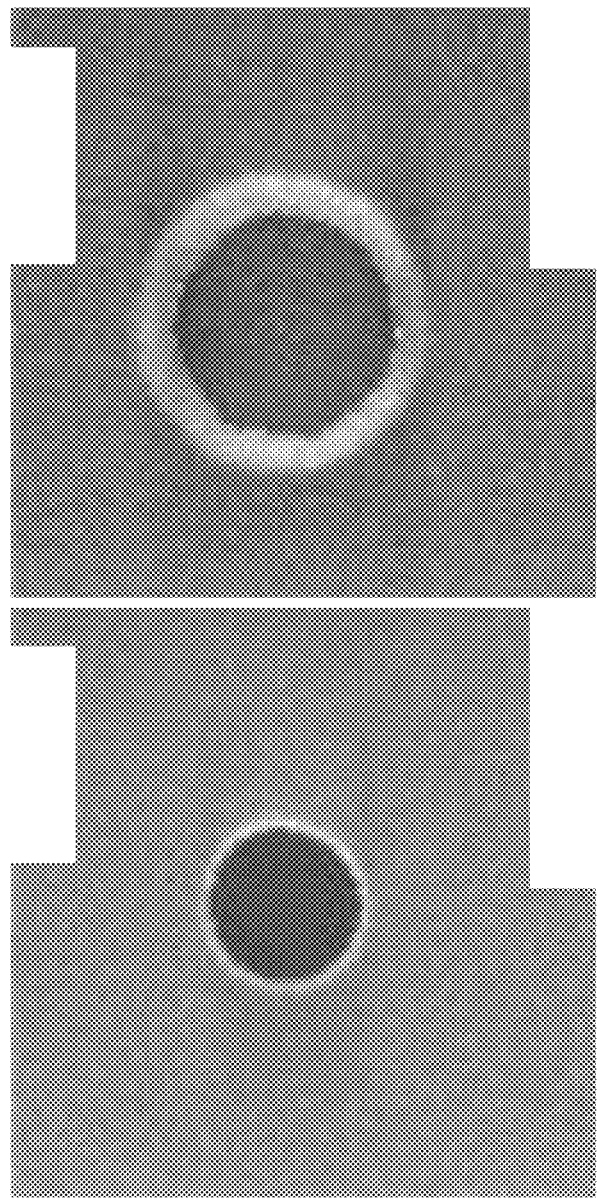
FIG. 4D
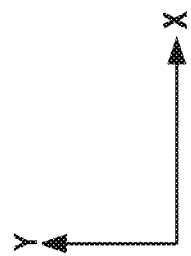

THREE-DIMENSIONAL MEMORY DEVICES AND METHODS FOR FORMING THE SAME

BACKGROUND

The present disclosure relates to memory devices, and fabrication methods thereof.

Planar memory cells are scaled to smaller sized by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation of planar memory cells. The 3D memory architecture includes a memory array and peripheral circuits for facilitating operations of the memory array.

SUMMARY

In one aspect, a method for forming a three-dimensional (3D) memory device includes forming a stack structure including interleaved conductive layers and dielectric layers in a staircase region of the stack structure on a substrate and one or more channel structures each extending in the stack structure in a core array region, patterning a surface of the stack structure opposite to the substrate to form one or more contact recesses, forming an etch mask on the surface of the stack structure and at least partially covering the one or more contact recesses, patterning the etch mask and the stack structure via the one or more contact recesses to form one or more trenches, each of the one or more trenches has a width smaller than that of the respective contact recess, and filling each of the one or more trenches with a conductive material to form one or more contact structures.

In some implementations, the method further includes patterning the etch mask to form mask holes, wherein patterning the etch mask and the stack structure are via the mask holes.

In some implementations, the method further includes simultaneously patterning the surface of the stack structure to form one or more contact recesses and a lateral connection recess, wherein a depth of one of the one or more contact recesses is the same as that of the lateral connection recess.

In some implementations, the method further includes removing the etch mask after etching to form the one or more trenches.

In some implementations, the method further includes planarizing the conductive material until a top of the one or more trenches.

In some implementations, a portion of the etch mask covering the one or more contact recesses is a thinned or bending portion of the etch mask.

In some implementations, etching the etch mask comprises etching through the thinned or bending portion of the etch mask.

In some implementations, the method further includes etching to form a channel plug hole to expose the channel structure; and filling the channel plug hole to form a channel plug on the channel structure.

In some implementations, etching the etch mask and the stack structure via the one or more contact recesses to form the one or more trenches includes etching to expose one of the conductive layers of the interleaved conductive layers and dielectric layers in the staircase region.

In some implementations, etching the etch mask and the stack structure via the one or more contact recesses to form the one or more trenches further includes etching to expose the substrate in the staircase region of the stack structure.

In some implementations, etching the etch mask and the stack structure via the one or more contact recesses to form the one or more trenches further includes etching to expose the substrate in a protection region of the stack structure.

In some implementations, etching the etch mask and the stack structure via the one or more contact recesses to form the one or more trenches further includes etching to expose one of the conductive layers of the interleaved conductive layers and dielectric layers in the staircase region, etching to expose the substrate in the staircase region of the stack structure, etching to expose the substrate in a peripheral region of the stack structure, and etching to expose the substrate in a protection region of the stack structure.

In some implementations, filling each of the one or more trenches with the conductive material to form the one or more contact structures includes filling tungsten (W).

In another aspect, a three-dimensional (3D) memory device includes a stack structure comprising interleaved conductive layers and dielectric layers and having a core array region and a staircase region; and one or more contact structures each extending in the stack structure, wherein each of the one or more contact structures comprises a head portion and a body portion, and a width of the head portion of the respective contact structure is larger than that of the body portion of the respective contact structure.

In some implementations, the 3D memory device further includes one or more channel structures each extending in the stack structure in the core array region.

In some implementations, the one or more contact structures includes a first contact structure extending in the staircase region of the stack structure and in contact with one of the conductive layers of the interleaved conductive layers and dielectric layers, a second contact structure extending in the core array region of the stack structure and in contact with a substrate, or a third contact structure extending in a peripheral region and in contact with the substrate.

In some implementations, the stack structure further includes a protection region in the plan view, and the one or more contact structures further comprise a fourth contact structure extending in the protection region of the stack structure and at least partially surrounding the core array region and the staircase region in the plan view.

In some implementations, the fourth contact structure includes a rectangle shape and has four sides connected to enclose the core array region and the staircase region in the plan view.

In some implementations, the width of the head portion is between 200 and 300 nm, and the width of the respective body portion is between 240 and 400 nm.

In some implementations, a material of each of the one or more contact structures includes tungsten (W).

In some implementations, the 3D memory device further includes a lateral connection structure extending in the stack structure, wherein a depth of the head portion is the same as that of the lateral connection structure.

In yet another aspect, a system includes a three-dimensional (3D) memory device configured to store data, the 3D memory device includes a stack structure comprising interleaved conductive layers and dielectric layers and having a core array region and a staircase region in a plan view, one or more channel structures each extending through the core array region of the stack structure, and one or more contact structures each extending in the stack structure, wherein each of the one or more contact structures comprises a head portion and a body portion, and a width of the head portion of the respective contact structure is larger than that of the body portion of the respective contact structure, and a memory controller coupled to the 3D memory device and configured to control the 3D memory device.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 4B illustrates transmission electron microscope (TEM) cross-sectional view images showing a comparison between the 3D memory device with and without head portion, according to some aspects of the present disclosure.

FIG. 4D illustrates TEM top view images showing a comparison between the 3D memory device with and without head portion, according to some aspects of the present disclosure.

Figure 1:
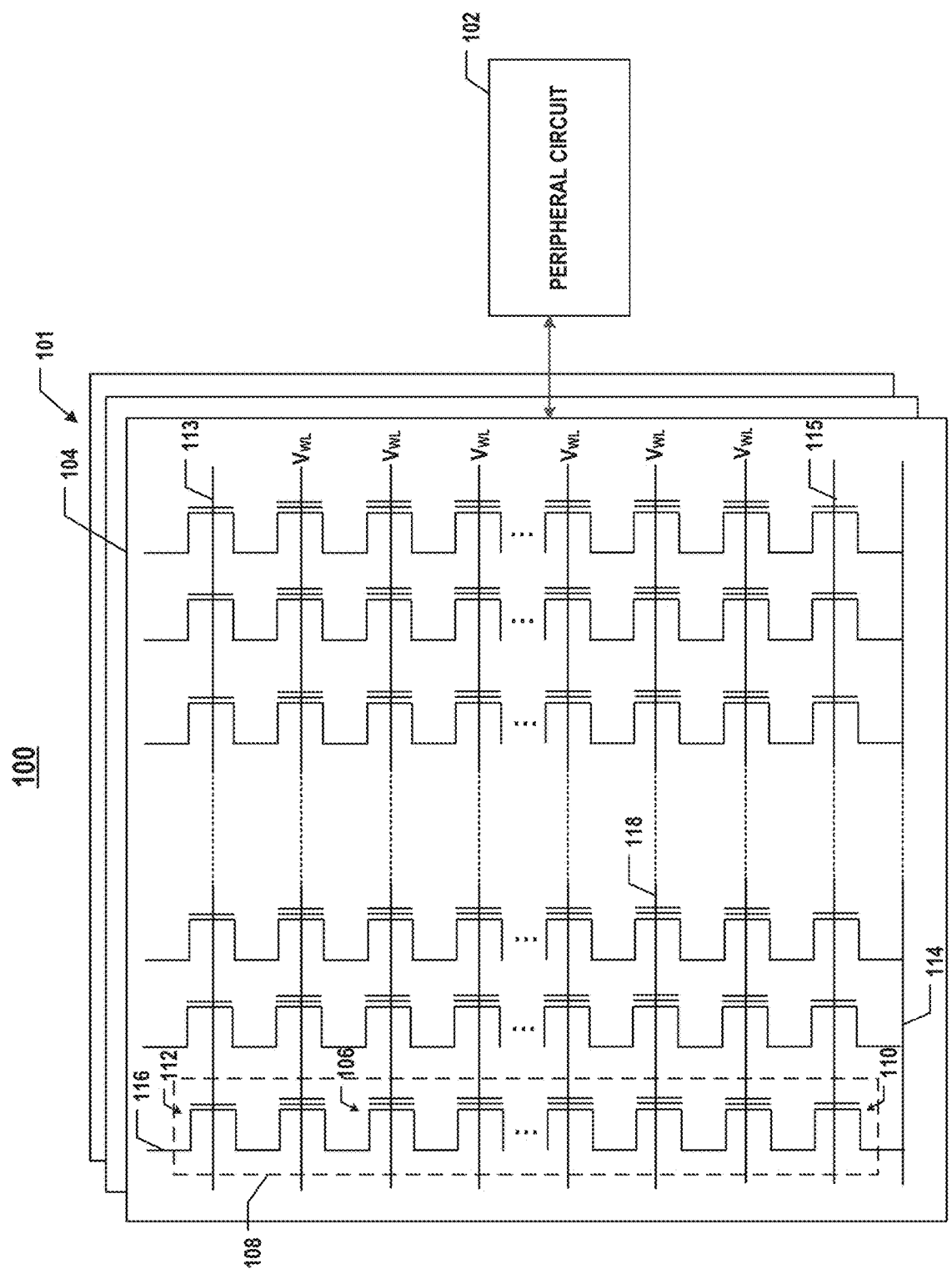
FIG. 1 illustrates a schematic circuit diagram of a memory device including peripheral circuits, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow.

With the development of three-dimensional (3D) memory devices, such as 3D NAND Flash memory devices, the more stacked layers (e.g., word lines) require more contact structures to be electrically connected to peripheral circuits for operating the 3D memory devices. To form multiple contact structures within the chip, the etching of trenches (e.g., through-holes) becomes critical. This is challenging when more stacks are required to form the 3D memory devices. In particular, it may require a higher aspect ratio etching to form a deep trench while retaining a small critical dimension (CD). Furthermore, the etching of the deep trench may form a bowing profile in the top portion of the trench. The bowing profile includes a tapered shape at the end of the trench. This allows gases, such as fluorine (F), to be accumulated in the bowing profile during the filing of the conductive material to form the contact structures. The large accumulation of the gases leads to a big void formed within the top portion of the contact structure. The big void formed near the contact portion of the contact structure may isolate and separate the contact structure from the other conductive layers, which causes a short circuit. This is also known as a puddle effect. Furthermore, the gases, such as fluorine, may attack and damage the metals, such as the metals (e.g., Cu) in the contact structures, the back end of lines (BEOL), or other conductive layers or semiconductor material (e.g., nitride compounds or silicon compounds), which result in the failure of the chip. This is also known as "F" attack. It is noted that the fluorine is generated during a tungsten (W) deposition with tungsten hexafluoride (WF6). Nevertheless, it is not necessary that the gases are formed by using WF6 during the deposition of tungsten. It can be other gases generated and accumulated during other deposition or etching processes.

One of the methods to solve the "F" attack issue is to optimize the profile of the etching of the trench. However, due to the high aspect ratio of the trench, it is not easy to optimize the profile on the top portion of the trench. And it may require additional processes to resolve the void issue within the contact structures, which increases the cost of the fabrication.

To address one or more of the aforementioned issues, the present disclosure introduces a solution in which one or more contact recesses are formed before forming one or more trenches. In particular, the one or more contact recesses are formed on the regions where the one or more trenches are formed on later, and the critical dimension of the contact recesses are slightly larger than that of respective trenches. This allows the deposition of the contact structures to fill the trench evenly and conformingly, and the gases may not be accumulated on the top portion of the trenches during the deposition. Furthermore, the process of forming the contact recesses can be done with other etching processes in a single process, such as a lateral connection structure, thereby significantly simplifying the fabrication process and reducing the overall cost.

The disclosed method can also be implemented in different kinds of contact structures including staircase contact structures (e.g., word line contacts), through array contact structure, peripheral contact structures, or seal ring contact structures. The optimized critical dimensions of the contact recesses and their respective contact structures therein disclosed in the present application provide a better deposition of the contact structures within the trenches and minimize the influence of the "F" attack and the puddle effect on the interfaces between the contact structures and other conductive layers.

Figure 4A:
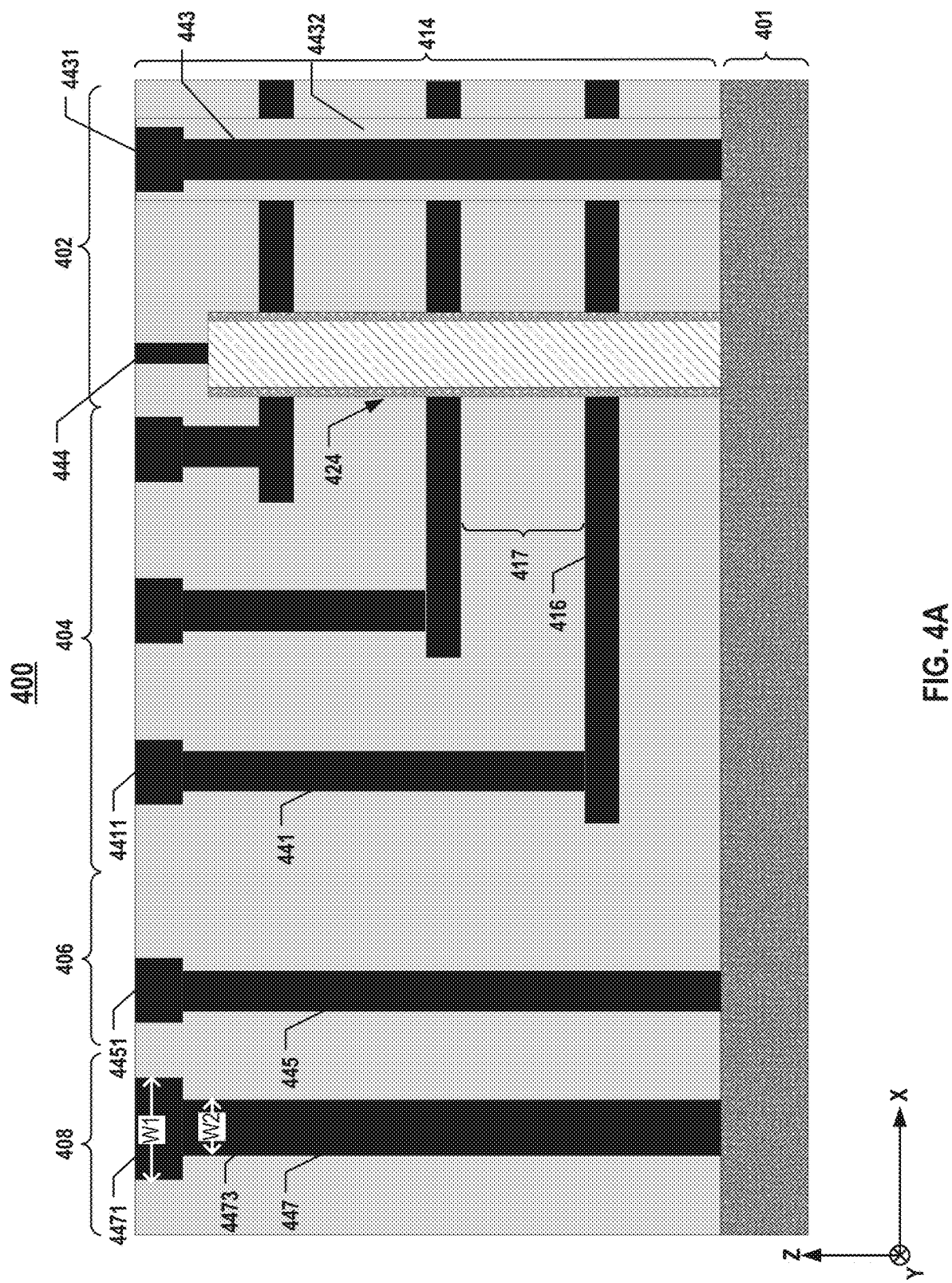
FIG. 4A illustrates a side view of a cross-section of a 3D memory device, according to some aspects of the present disclosure.

FIG. 1 illustrates a schematic circuit diagram of a memory device 100 including peripheral circuits, according to some aspects of the present disclosure. Memory device 100 can include a memory cell array 101 and peripheral circuits 102 coupled to memory cell array 101. Memory cell array 101 can be a NAND Flash memory cell array in which memory cells 106 are provided in the form of an array of 3D NAND memory strings 108 each extending vertically above a substrate (not shown). In some implementations, each 3D NAND memory string 108 includes a plurality of memory cells 106 coupled in series and stacked vertically. Each memory cell 106 can hold a continuous, analog value, such as an electrical voltage or charge, that depends on the number of electrons trapped within a region of memory cell 106. Each memory cell 106 can be either a floating gate type of memory cell including a floating-gate transistor or a charge trap type of memory cell including a charge-trap transistor. Each array of 3D NAND memory strings 108 can include one or more 3D memory devices. For example, FIG. 4A illustrates some exemplary 3D NAND memory devices including a 3D memory device 400.

In some implementations, each memory cell 106 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 106 is a multi-level cell (MLC) that is capable of storing more than a single bit of data in four or more memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1, each 3D NAND memory string 108 can include a source select gate (SSG) transistor 110 at its source end and a drain select gate (DSG) transistor 112 at its drain end. SSG transistor 110 and DSG transistor 112 can be configured to activate selected 3D NAND memory strings 108 (columns of the array) during read and program operations. In some implementations, the sources of SSG transistors 110 of 3D NAND memory strings 108 in the same block 104 are coupled through a same source line (SL) 114, e.g., a common SL, for example, to the ground. DSG transistor 112 of each 3D NAND memory string 108 is coupled to a respective bit line 116 from which data can be read or programmed via an output bus (not shown), according to some implementations. In some implementations, each 3D NAND memory string 108 is configured to be selected or unselected by applying a select voltage (e.g., above the threshold voltage of DSG transistor 112) or a deselect voltage (e.g., 0 V) to respective DSG transistor 112 through one or more DSG lines 113 and/or by applying a select voltage (e.g., above the threshold voltage of SSG transistor 110) or a deselect voltage (e.g., 0 V) to respective SSG transistor 110 through one or more SSG lines 115.

As shown in FIG. 1, 3D NAND memory strings 108 can be organized into multiple blocks 104, each of which can have a common source line 114. In some implementations, each block 104 is the basic data unit for erase operations, i.e., all memory cells 106 on the same block 104 are erased at the same time. Memory cells 106 can be coupled through word lines 118 that select which row of memory cells 106 is affected by read and program operations. In some implementations, each word line 118 is coupled to a row of memory cells 106, which is the basic data unit for program and read operations. Each word line 118 can be coupled to a plurality of control gates (gate electrodes) at each memory cell 106 in respective row and a gate line coupling the control gates.

Figure 2:
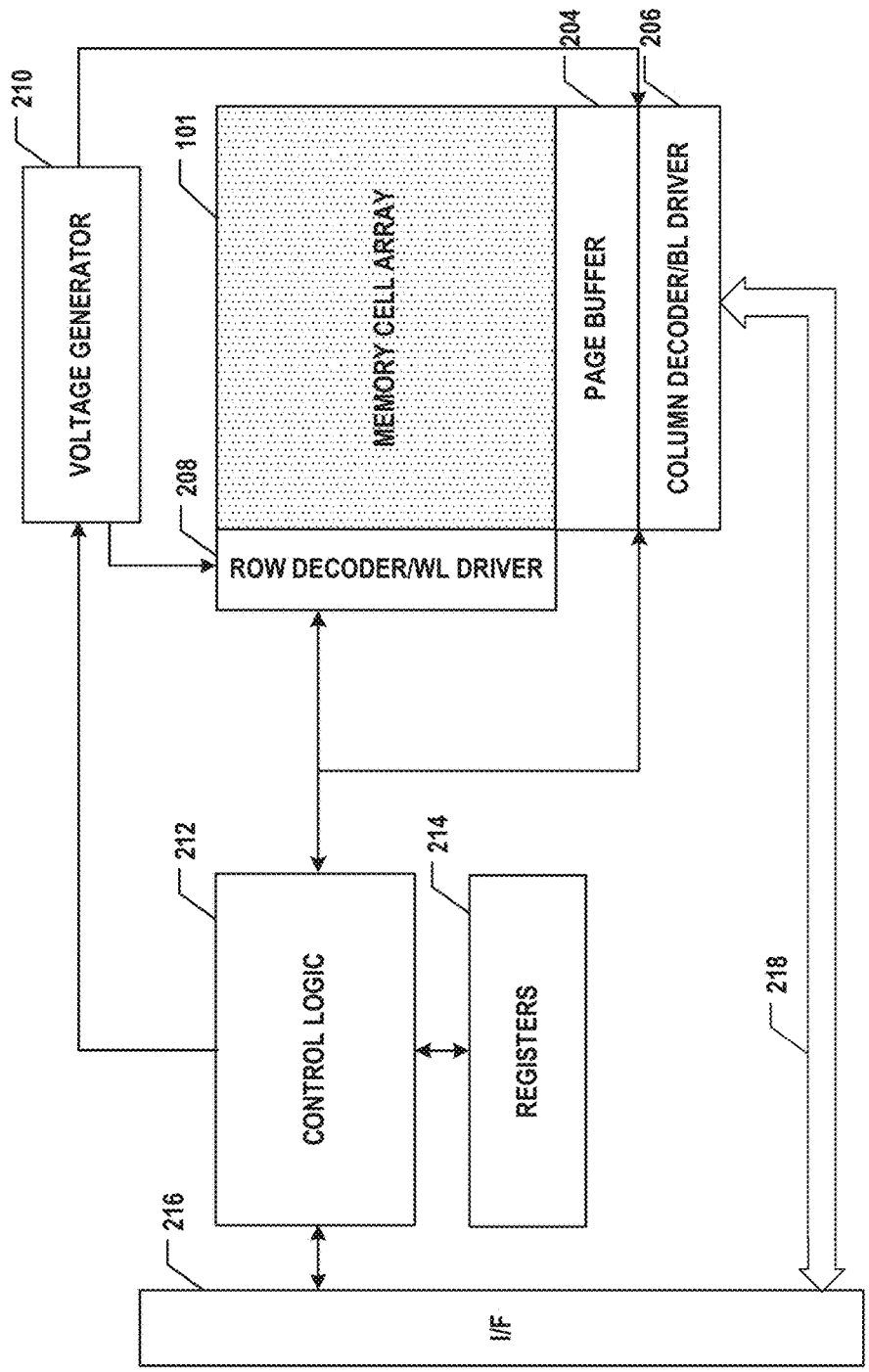
FIG. 2 illustrates a block diagram of a memory device including a memory cell array and peripheral circuits, according to some aspects of the present disclosure.

Peripheral circuits 102 can be coupled to memory cell array 101 through bit lines 116, word lines 118, source lines 114, SSG lines 115, and DSG lines 113. As described above, peripheral circuits 102 can include any suitable circuits for facilitating the operations of memory cell array 101 by applying and sensing voltage signals and/or current signals through bit lines 116 to and from each target memory cell 106 through word lines 118, source lines 114, SSG lines 115, and DSG lines 113. Peripheral circuits 102 can include various types of peripheral circuits formed using complementary metal-oxide semiconductor (CMOS) technologies. For example, FIG. 2 illustrates some exemplary peripheral circuits 102 including a page buffer 204, a column decoder/bit line driver 206, a row decoder/word line driver 208, a voltage generator 210, control logic 212, registers 214, an interface (I/F) 216, and a data bus 218. It is understood that in some examples, additional peripheral circuits 102 may be included as well.

Page buffer 204 can be configured to buffer data read from or programmed to memory cell array 101 according to the control signals of control logic 212. In one example, page buffer 204 may store one page of program data (write data) to be programmed into one row of memory cell array 101. In another example, page buffer 204 also performs program verify operations to ensure that the data has been properly programmed into memory cells 106 coupled to selected word lines 118.

Row decoder/word line driver 208 can be configured to be controlled by control logic 212 and select or unselect a block 104 of memory cell array 101 and select or unselect a word line 118 of selected block 104. Row decoder/word line driver 208 can be further configured to drive memory cell array 101. For example, row decoder/word line driver 208 may drive memory cells 106 coupled to the selected word line 118 using a word line voltage generated from voltage generator 210. In some implementations, row decoder/word line driver 208 can include a decoder and string drivers (driving transistors) coupled to local word lines and word lines 118.

Voltage generator 210 can be configured to be controlled by control logic 212 and generate the word line voltages (e.g., read voltage, program voltage, pass voltage, local voltage, and verification voltage) to be supplied to memory cell array 101. In some implementations, voltage generator 210 is part of a voltage source that provides voltages at various levels of different peripheral circuits 102 as described below in detail. Consistent with the scope of the present disclosure, in some implementations, the voltages provided by voltage generator 210, for example, to row decoder/word line driver 208 and page buffer 204 are above certain levels that are sufficient to perform the memory operations. For example, the voltages provided to page buffer 204 may be between 2 V and 3.3 V, such as 3.3 V, and the voltages provided to row decoder/word line driver 208 may be greater than 3.3 V, such as between 3.3 V and 30 V.

Column decoder/bit line driver 206 can be configured to be controlled by control logic 212 and select one or more 3D NAND memory strings 108 by applying bit line voltages generated from voltage generator 210. For example, column decoder/bit line driver 206 may apply column signals for selecting a set of N bits of data from page buffer 204 to be outputted in a read operation.

Control logic 212 can be coupled to each peripheral circuit 102 and configured to control operations of peripheral circuits 102. Registers 214 can be coupled to control logic 212 and include status registers, command registers, and address registers for storing status information, command operation codes (OP codes), and command addresses for controlling the operations of each peripheral circuit 102.

Interface 216 can be coupled to control logic 212 and configured to interface memory cell array 101 with a memory controller (not shown). In some implementations, interface 216 act as a control buffer to buffer and relay control commands received from the memory controller and/or a host (not shown) to control logic 212 and status information received from control logic 212 to the memory controller and/or the host. Interface 216 can also be coupled to page buffer 204 and column decoder/bit line driver 206 via data bus 218 and act as an input/output (I/O) interface and a data buffer to buffer and relay the program data received from the memory controller and/or the host to page buffer 204 and the read data from page buffer 204 to the memory controller and/or the host. In some implementations, interface 216 and data bus 218 are part of an I/O circuit of peripheral circuits 102.

Consistent with the scope of the present disclosure, at least one peripheral circuit 102 of memory device 100 can have 3D transistors instead of planar transistors in order to achieve high speed, low leakage current, high voltage, and small size at the same, without increasing the cost. It is understood that in some examples, both 3D transistors and planar transistors may be used in the same peripheral circuit 102.

Figure 3A:
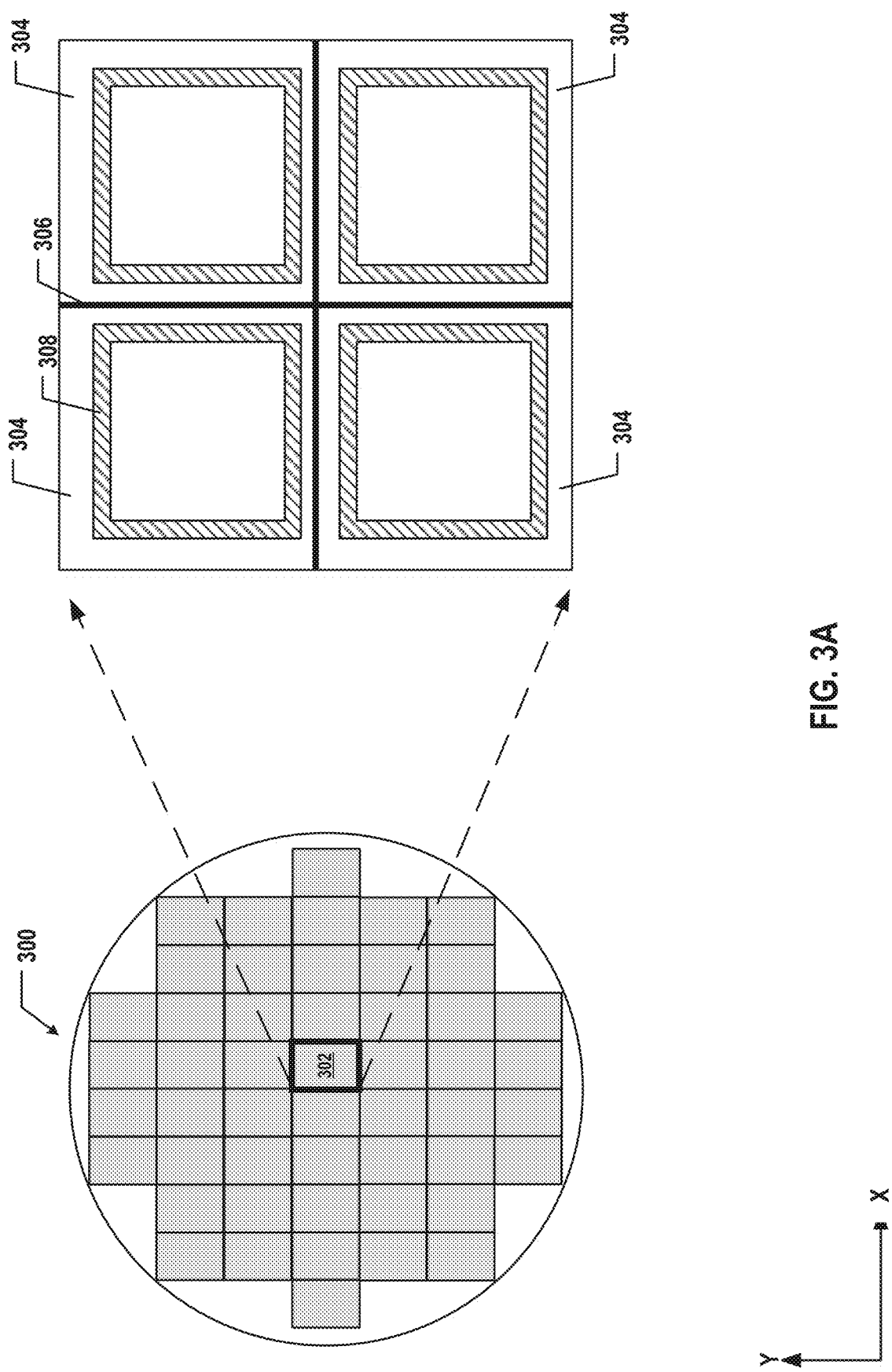
FIG. 3A illustrates a plan view of a wafer having a plurality of semiconductor chips each having a seal ring contact structure, according to some aspects of the present disclosure.

In semiconductor chips, protection structures for preventing various types of damages, such as electrostatic discharge (ESD), oxygen, moisture, and mechanical damages, can be formed for each chip. For example, FIG. 3A illustrates a plan view of a wafer 300 having a plurality of semiconductor dies 304 each having a protection structure 308. Wafer 300 includes multiple shots 302 each including four dies, referred to herein as semiconductor dies 304, separated by scribe lines 306. As shown in FIG. 3A, each semiconductor die 304 has an adjacent semiconductor die 304 in a first direction (x-direction) and another adjacent semiconductor die 304 in a second direction (y-direction) perpendicular to the first direction. Each semiconductor die 304 includes a protection structure 308 for protecting the semiconductor devices from damages, such as ESD, oxygen, moisture, and mechanical damages.

Figure 3B:
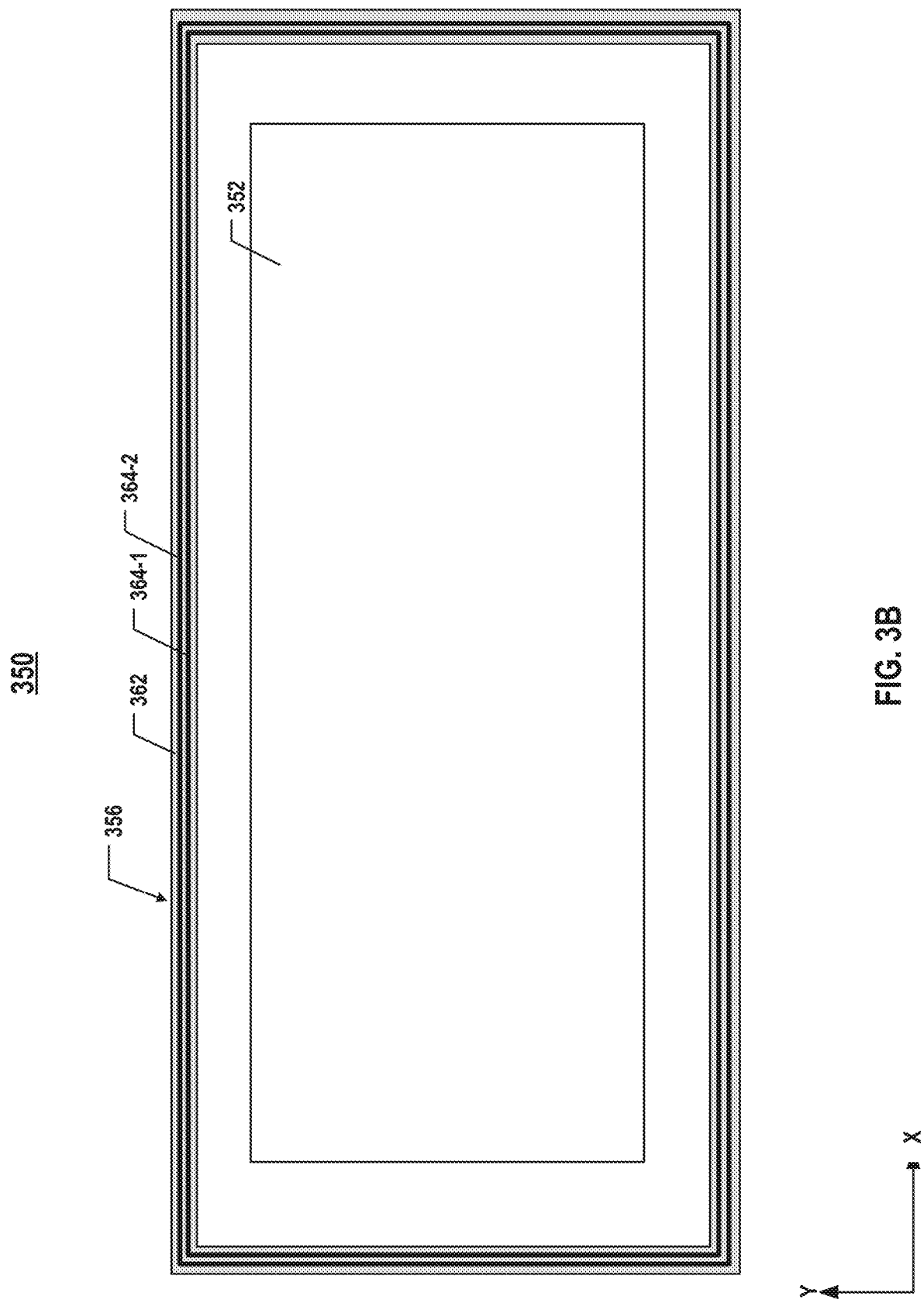
FIG. 3B illustrates a plan view of a semiconductor chip having a seal ring contact structure, according to some aspects of the present disclosure.

For example, FIG. 3B illustrates a plan view of a semiconductor chip 350 having a protection structure. Semiconductor chip 350 is one example of semiconductor die 304 having protection structure 308 in FIG. 3A. Semiconductor chip 350 includes a main chip region 352 to be protected by the protection structure. The protection structure in this example includes two separate parts: an inner guard ring (not shown) and an outer seal ring 356 as shown in the plan view. It is understood that the plan view of FIG. 3B may be at a cross-section in any suitable plane defined by the x-axis and y-axis parallel to the substrate surface. Outer seal ring 356 includes an outer dielectric layer 362 and multiple metal layers 364-1 and 364-2 in outer dielectric layer 362.

FIG. 4A illustrates a side view of a cross-section of an exemplary 3D memory device 400 having a contact structure with a nail head portion, according to some implementations of the present disclosure. As shown in FIG. 4A, 3D memory device 400 can include a substrate 401, which can include silicon (e.g., single crystalline silicon, c-Si), silicon germanium (SiGe), gallium arsenide (GaAs), germanium (Ge), silicon on insulator (SOI), or any other suitable materials. It is noted that x-, y-, and z-axes are included in FIG. 4A to illustrate the spatial relationships of the components in 3D memory device 400. Substrate 401 includes two lateral surfaces extending laterally in the x-y plane: a front surface on the front side of the wafer, and a back surface on the backside opposite to the front side of the wafer. The x- and y-directions are two orthogonal directions in the wafer plane: x-direction is the word line extending direction, and the y-direction is the bit line extending direction. The z-axis is perpendicular to both the x- and y-axes. As used herein, whether one component (e.g., a layer or a device) is "on," "above," or "below" another component (e.g., a layer or a device) of a semiconductor device (e.g., 3D memory device 400) is determined relative to the substrate of the semiconductor device (e.g., substrate 401) in the z-direction (the vertical direction perpendicular to the x-y plane) when the substrate is positioned in the lowest plane of the semiconductor device in the z-direction. The same notion for describing spatial relationships is applied throughout the present disclosure.

In some implementations, 3D memory device 400 further includes one or more contact structures (e.g., third contact structure 441, fourth contact structure 443, second contact structure 445, first contact structure 447, etc.) each including a head portion (e.g., a nail head portion). The contact structure can include lateral contact structures and vertical contact structures. In some implementations, third contact structure 441, fourth contact structure 443, second contact structure 445, and first contact structure 447 are vertical contact structures. It is noted that the "contact structure" herein may refer not only to those structures that connect 3D memory device 400 to word lines, peripheral circuits, but also to those structures extending in the z-direction (e.g., vertical direction) through 3D memory device 400 encircling any functional region of 3D memory device 400 and connected to a ground pad, a fan-out pad, a bonding pad, or a landing pad to form an isolation structure or a protection structure of 3D memory device 400. In some implementations, the contact structures may be at least partially surrounded or covered by interlayer dielectric (ILD) (not shown) in the x and/or y-direction (e.g., lateral direction) and extending along the z-direction (e.g., vertical direction). The contact structure can include conductive materials including, but not limited to, tungsten (W), cobalt (Co), copper (Cu), aluminum (Al), silicides, or any combination thereof. The ILD layers in the contact structure can include dielectric materials including, but not limited to, silicon oxide, silicon nitride, silicon oxynitride, low dielectric constant (low-k) dielectrics, or any combination thereof.

In some implementations, 3D memory device 400 further includes one or more contact layers (not shown) or bonding layers (not shown) connected to the one or more contact structures. It is noted that these contact layers and bonding layers may have different materials than the contact structures. Alternatively, there may be interfaces that can be observed by microscopy techniques, e.g., Scanning Electron Microscopy (SEM) or Transmission Electron Microscopy (TEM), between these contact layers or bonding layers and the contact structures such that they are separate layers. Also, though each of the contact structures has a head portion and a body portion connected to the head portion, the head portion and the body portion are parts of the contact structure, and there is no interface between the head portion and the body portion of the contact structures, according to some implementations of the present disclosure. In some implementations, the contact structure has the head portion at one end of the contact structure (e.g., an opposite end to substrate 401).

In some implementations, 3D memory device 400 is a NAND Flash memory device in which memory cells are provided in the form of an array of NAND memory strings. As shown in FIG. 4A, 3D memory device 400 can include an array of channel structures 424 functioning as the array of NAND memory strings. As shown in FIG. 4A, each channel structure 424 can extend vertically through a plurality of conductive pairs each including a conductive layer 416 and a dielectric layer 417. The interleaved conductive layers and dielectric layers are part of a stack structure 414. The number of the conductive pairs of conductive layers and dielectric layers in stack structure 414 (e.g., 32, 64, 96, 128, 160, 192, 224, 256, or more) determines the number of memory cells in 3D memory device 400. It is understood that in some implementations, stack structure 414 may have a multi-deck architecture (not shown), which includes a plurality of memory decks stacked over one another. The numbers of the conductive pairs of conductive layers and dielectric layers in each memory deck can be the same or different.

Stack structure 414 can include a plurality of interleaved conductive layers and dielectric layers. Conductive layers 416 and dielectric layers 417 in stack structure 414 can alternate in the z-direction (e.g., vertical direction). In other words, except the ones at the top or bottom of stack structure 414, each conductive layer 416 can be adjoined by two dielectric layers 417 on both sides, and each dielectric layer 417 can be adjoined by two conductive layers 416 on both sides. Conductive layers 416 can include conductive materials including, but not limited to, W, Co, Cu, Al, polysilicon, doped silicon, silicides, or any combination thereof. Each conductive layer 416 can include a gate electrode (gate line) surrounded by an adhesive layer and a gate dielectric layer. The gate electrode of conductive layer can extend laterally as a word line, ending at one or more staircase structures of stack structure 414. Dielectric layers 417 can include dielectric materials including, but not limited to, silicon oxide, silicon nitride, silicon oxynitride, or any combination thereof.

As shown in FIG. 4A. 3D memory device 400 includes a core array region 402, a staircase region 404, a peripheral region 406, and a protection region 408 in the plan view, according to some implementations of the present disclosure. In FIG. 4A, core array region 402, i.e., center core array region, may be in the center of the stack structure, and staircase region 404, i.e., a side staircase region, may be at one of two sides of the core array region 402 of the stack structure 414 in the x-direction (e.g., the word line direction), according to some implementations. 3D memory device 400 may include multiple core array regions 402 and staircase regions 404 which are connected by a lateral connection structure. In some implementations, the lateral connection structure may include stair shape or pattern shape extending in the z-direction (e.g., vertical direction) that can reduce the stress of the chip. In some implementations, the lateral connection structure is configured to connect conductive layer 416 of the conductive pairs laterally (e.g., in the y- or x-direction) among different blocks or among different array common source (ACS) in the same block. In some implementations, the lateral connection structure may include two extended portions (not shown) each extending in the z-direction to contact two conductive layers 416 which are connected to two respective ACSs. As such, the lateral connection structure may be an upside down U-shape in a cross-sectional view (e.g., in the x- or y-direction). In some implementations, the lateral connection structure may be formed in a gate line slit (GLS) region in which gate line conductive layers are also formed. The GLS region may separate memory strings into multiple blocks. For example, the lateral connection structure may be connected between the two adjacent gate line conductive layers in x-direction, e.g., as a bridge structure. In some implementations, a material of the gate line conductive layers may include W, Co, Cu, Al, silicides, or any combination thereof. In some implementations, peripheral region 406 is arranged outside of core array region 402 and staircase region 404 such that second contact structure 445 (e.g., a peripheral contact structure) extends vertically (e.g., in the z-direction) through the entire stack structure 414 and is in contact with substrate 401. In some implementations, protection region 408 is arranged surrounding core array region 402, staircase region 404, and peripheral region 406.

In some implementations, channel structure 424 is formed in core array region 402. Channel structure 424 may include a channel hole filled with a semiconductor layer (e.g., as a semiconductor channel) and a composite dielectric layer (e.g., as a memory film). In some implementations, the semiconductor channel includes silicon, such as amorphous silicon, polysilicon, or single crystalline silicon. In some implementations, the memory film is a composite layer including a tunneling layer, a storage layer (also known as a "charge trap layer"), and a blocking layer. The remaining space of channel structure 424 can be partially or fully filled with a capping layer including dielectric materials, such as silicon oxide, and/or an air gap. Channel structure 424 can have a cylinder shape (e.g., a pillar shape). The capping layer, the semiconductor channel, the tunneling layer, the storage layer, and the blocking layer of the memory film are arranged radially from the center toward the outer surface of the pillar in this order, according to some implementations. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, the memory film can include a composite layer of silicon oxide/silicon oxynitride/silicon oxide (ONO).

In some embodiments, channel structure 424 further includes a channel plug 444 in the top portion (e.g., at the upper end) of channel structure 424. As used herein, the "upper end" of a component (e.g., channel structure 424) is the end farther away from substrate 401 in the z-direction, and the "lower end" of the component (e.g., channel structure 424) is the end closer to substrate 401 in the z-direction when substrate 401 is positioned in the lowest plane of 3D memory device 400. Channel plug 444 can include semiconductor materials (e.g., polysilicon). In some embodiments, channel plug 444 functions as the drain of the NAND memory string.

In some implementations, third contact structures 441 are formed in staircase region 404. In some embodiments, each of third contact structures 441 is in contact with a respective conductive layer 416 of conductive pair (e.g., a word line) in staircase region 404 of stack structure 414 for word line fan-out. Therefore, third contact structure 441 can also be a staircase contact structure. In some implementations, third contact structures 441 can be electrically connected to a word line fan-oud pad. Third contact structures 441 can include one or more conductive layers, such as a metal layer (e.g., W, Co, Cu, or Al) or a silicide layer surrounded by an adhesive layer (e.g., TiN).

In some embodiments, one or more fourth contact structures 443 are formed in core array region 402. In some embodiments, fourth contact structure 443 can be a through array contact (TAC) structure extending through stack structure 414 of 3D memory device 400 and in contact with substrate 401. Fourth contact structure 443 may be electrically connected to a peripheral circuit or external circuit (e.g., fan-out pad) at the opposite side of substrate 401. In some implementations, fourth contact structure 443 may further include a spacer 4432 which separate and isolate fourth contact structure 443 from electrically connecting to conductive layers 416 (e.g., word lines). Fourth contact structure 443 can include one or more conductive layers, such as a metal layer (e.g., W, Co, Cu, or Al) or a silicide layer surrounded by an adhesive layer (e.g., TiN).

In some embodiments, one or more second contact structures 445 are formed in peripheral region 406. In some embodiments, second contact structure 445 can be a peripheral circuit contact structure through which 3D memory device 400 is electrically connected to a peripheral circuit via the opposite side of substrate 401. In some implementations, second contact structure 445 extends vertically (in the z-direction) and is in contact with substrate 401 (e.g., an N-well of a P-type silicon substrate). In some implementations, second contact structure 445 may also penetrate through substrate 401 and be electrically connected to the peripheral circuit via the side of substrate 401. Second contact structure 445 can include one or more conductive layers, such as a metal layer (e.g., W, Co, Cu, or Al) or a silicide layer surrounded by an adhesive layer (e.g., TiN).

In some implementations, first contact structure 447 is a protection structure (e.g., a seal ring contact structure, such as outer seal ring 356 in FIG. 3B) formed in protection region 408 and at least partially surrounding core array region 402 and staircase region 404 in the plan view. In some implementations, first contact structure 447 includes a rectangle shape and has four sides connected to enclose core array region 402 and/or staircase region 404 in the plan view, which can also be illustrated as in FIG. 3B. It is noted that first contact structure 447 can include any other suitable shapes, such as square, circle, oval, etc., for example, depending on the shape of core array region 402 and staircase region 404.

First contact structure 447 can be configured to provide protection to 3D memory device 400 in core array region 402 from various types of damages including, but not limited to, heat, gases (e.g., oxygen), liquids (e.g., moisture), mechanical damages (e.g., cutting), and electrical damages (e.g., ESD). First contact structure 447 can provide a hermetic seal to protect 3D memory device 400 in core array region 402 from mechanical damages during cutting and to block entry of external moisture and oxygen into core array region 402, as well as can protect 3D memory device 400 in core array region 402 from ESD. In some embodiments, first contact structure 447 is attached to a ceramic or metal lid in the packaging of 3D memory device 400 to form a hermetic seal. In some embodiments, first contact structure 447 is electrically connected to an ESD protection circuit and/or the ground.

In some embodiments, first contact structure 447 may include a dielectric portion (not shown) and a conductive portion in the dielectric portion. The dielectric portion can fill the entire first contact structure 447 except for the area occupied by the conductive portion. That is, the conductive portion of first contact structure 447 can be electrically insulated by the dielectric layer. The dielectric portion of first contact structure 447 can include any dielectric materials including, but not limited to, silicon oxide, silicon nitride, silicon oxynitride, high dielectric-constant (k) dielectrics (e.g., aluminum oxide, hafnium oxide, zirconium oxide, etc.), or any combination thereof. In some embodiments, the conductive portion of first contact structure 447 may be electrically connected to the conductive portion to an ESD protection circuit and or the ground. For example, the conductive portion of first contact structure 447 may be electrically connected to the ESD protection circuit and/or the ground through another contact structure of 3D memory device 400, such as a middle-end-of-line (MEOL) contact structure or a back-end-of-line (BEOL) contact structure. The conductive portion of first contact structure 447 can include conductive materials including, but not limited to, W, Co, Cu, Al, silicides, or any combination thereof. In some embodiments, the conductive portion of first contact structure 447 maybe eventually spaced apart along the four sides of first contact structure 447 to reduce the resistance.

Each of contact structures (e.g., first contact structure 447, second contact structure 445, third contact structure 441, or fourth contact structure 443) may include a head portion (e.g., a first head portion 4471 of first contact structure 447, a second head portion 4451 of second contact structure 445, a third head portion 4411 of third contact structure 441, and a fourth head portion 4431 of fourth contact structure 443). In some implementations, each head portion has a width in a lateral direction (e.g., in x- or y-direction) that corresponds to a width of each body portion of the contact structures. That is, the width of the head portion (e.g., 4471) is larger than the width of the body portion 4473 of the contact structure (e.g., 447). For example, first head portion 4471 of the first contact structure 447 has a width of W1, and the body portion 4473 of the first contact structure 447 has a width of W2. The width W1 of first head portion 4471 is larger than the width of the body portion 4473 such that, as mentioned above, the head portion may reduce the "F" attack and the puddle effect when bonding to bonding pads, external circuits, or other peripherical circuits. The failure of the chip caused by the "F" attack and the puddle effect can be minimized. The critical dimension of width W1 may be, for example, between 240 and 400 nm, while the critical dimension of width W2 may be, for example, between 200 and 300 nm. A difference between the width W1 and the width W2 can be, for example, between 40 and 100 nm. It is noted that while the widths of each body portions of other contact structures and their corresponding head portion may be different from the width W2 and width W1, they may have the same or similar width ratio, or the same or similar width difference as that of width W2 and width W1. For instance, a difference between the width of first head portion 4471 and body portion 4473 may be the same as a difference between the width of second head portion 4451 and body portion of second contact structure 445. In another example, a ratio between the width of first head portion 4471 and body portion 4473 may be the same as a ratio between the width of second head portion 4451 and body portion of second contact structure 445. It is also noted that, although each contact structure has respective head portion and body portion 4473, there may not exist any interfaces between the two structures (i.e., head portion 4471 and body portion 4473), according to some implementations of the present disclosure. It is also noted that, though head portion 4471 and body portion 4473 may have different widths along their structures, the critical dimension of the width can be measured and determined by an uppermost part of the structures, according to some implementations of the present disclosure.

FIG. 4B illustrates transmission electron microscope (TEM) cross-sectional view images showing a comparison between a part of 3D memory device 400 (e.g., first contact structure 447) with (i.e., the right figure) and without (i.e., the left figure) the head portion, according to some aspects of the present disclosure. As FIG. 4B shows, without the head portion, voids caused by gases (e.g., fluorine) may be kept within the contact structures. These voids may lead to chip failure (e.g., short circuit) when the contact structures are later bonded to bonding pads or peripheral circuits. With the head portion, these voids are significantly reduced. Furthermore, without the head portion, the end portion (e.g., a top portion) of the contact structure has a tapered shape which is a relatively narrower channel for gases to leak out, resulting in accumulating more gases at the end portion of the contact structures. With the head portion, these voids, even not being eliminated, may not be accumulated at the end portion of the contact structures. Without the voids located at the end portion of the contact structures, the chip may not be failed due to the voids after the bonding process.

Figure 4C:
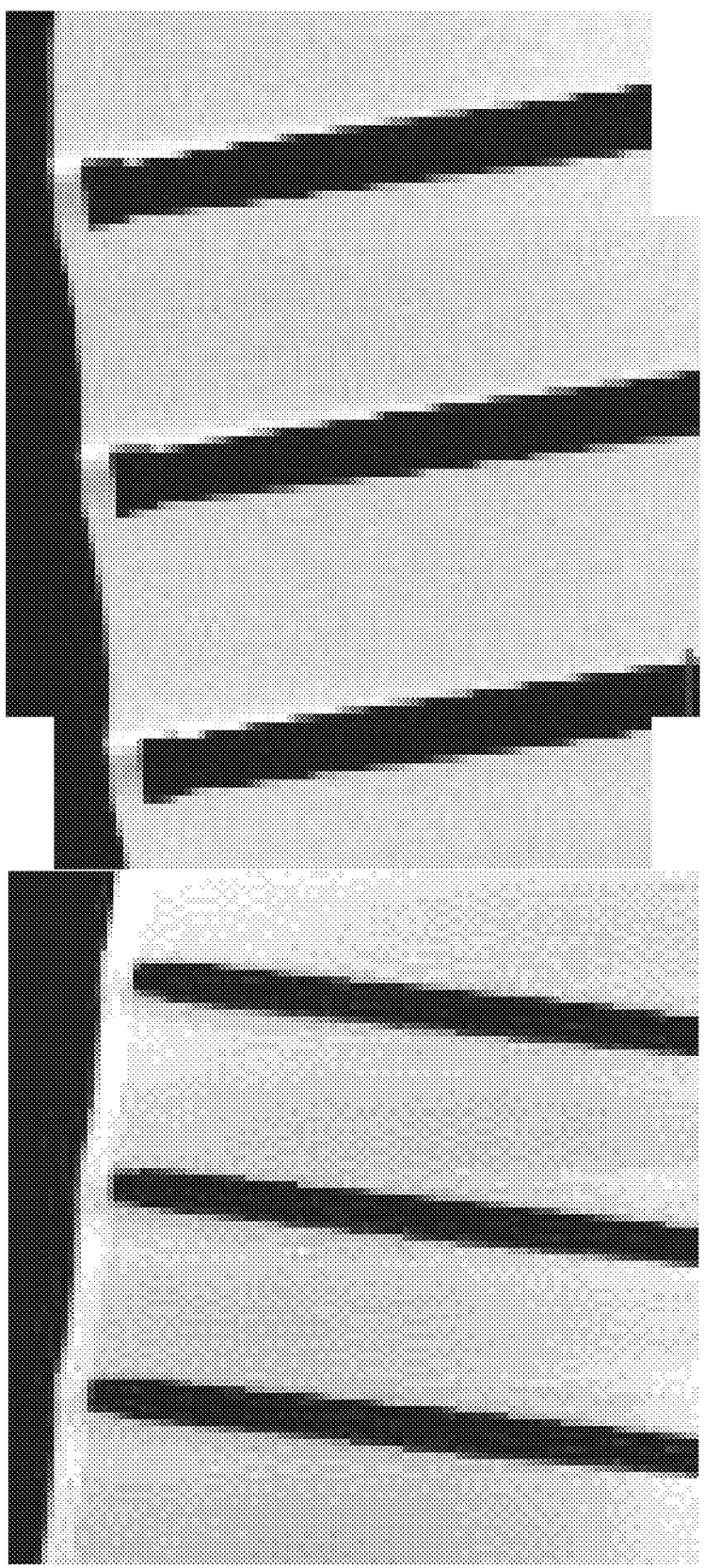
FIG. 4C illustrates TEM cross-sectional view images showing a comparison between the 3D memory device with and without head portion, according to some aspects of the present disclosure.

FIG. 4C illustrates TEM cross-sectional view images showing a comparison between another part of 3D memory device 400 (e.g., second contact structure 445) with (i.e., the right figure) and without (i.e., the left figure) the head portion, according to some aspects of the present disclosure. Same or similar to FIG. 4B, FIG. 4C shows that the head portion may not necessarily be a rectangular shape in the cross-sectional view, but can be a trapezoid or an inverted trapezoid shape in the cross-sectional view, according to some implementations. The head portion can also be any other shapes that have a larger width than the body portion 4473 of the contact structure.

FIG. 4D illustrates TEM top view images showing a comparison between the part of the 3D memory device 400 (e.g., second contact structure 445) with (i.e., the right figure) and without (i.e., the left figure) the head portion, according to some aspects of the present disclosure. After strip inspection, the contact structure with head portion conformally formed within the trench.

Figure 5A:
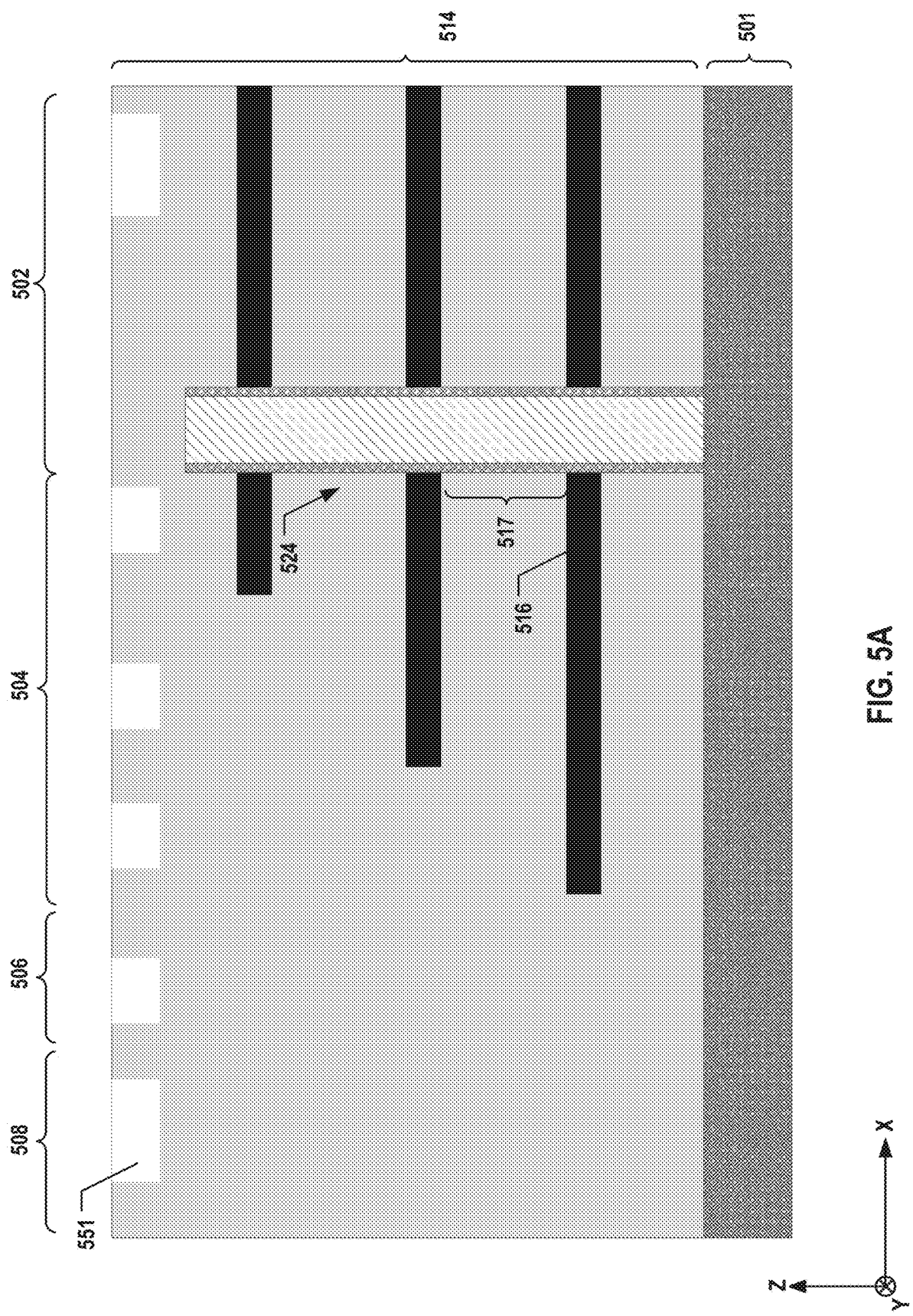
FIGS. 5A-5D illustrate a fabrication process for forming a 3D memory device, according to some aspects of the present disclosure.
Figure 5B:
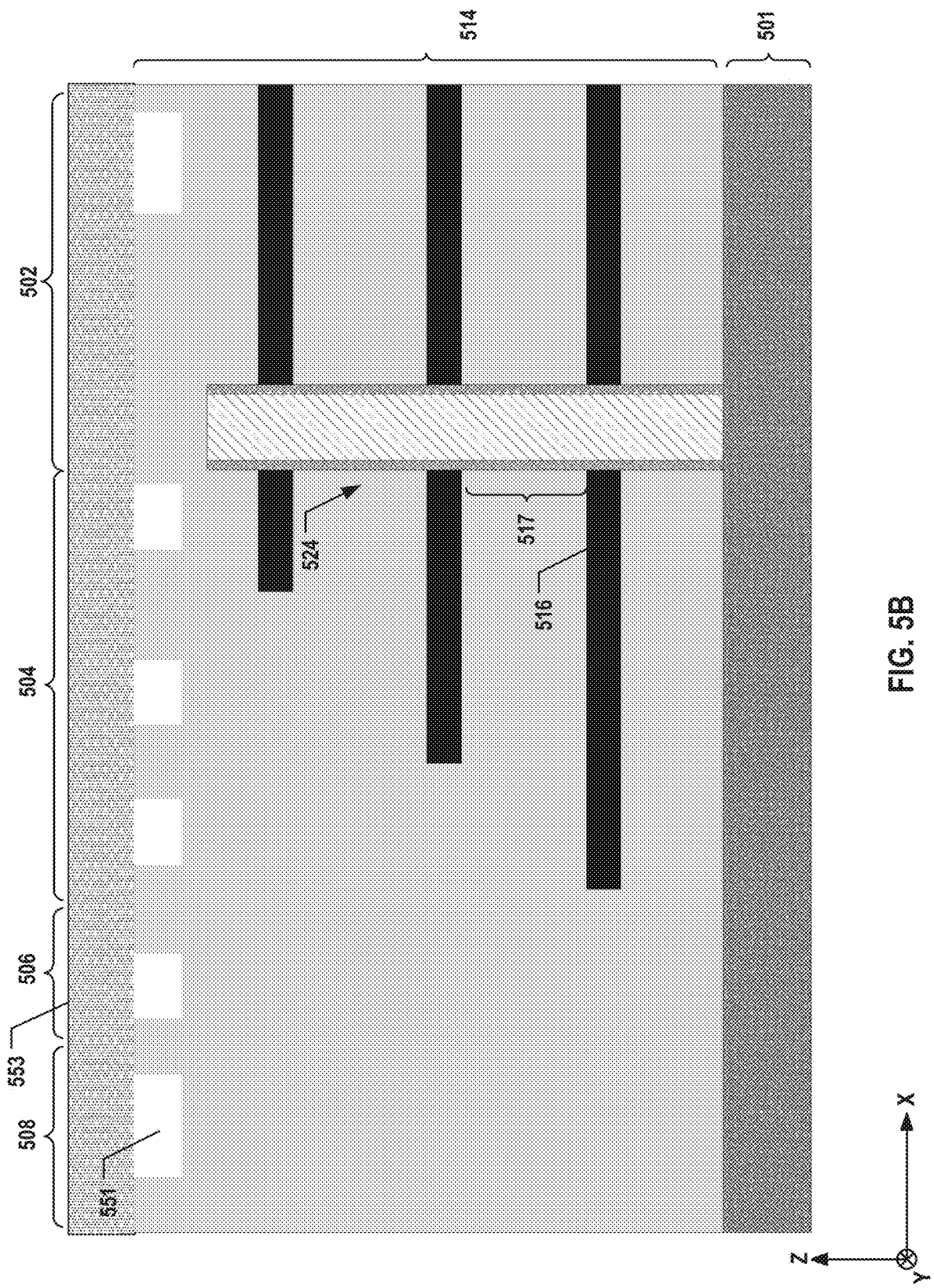
Figure 5C:
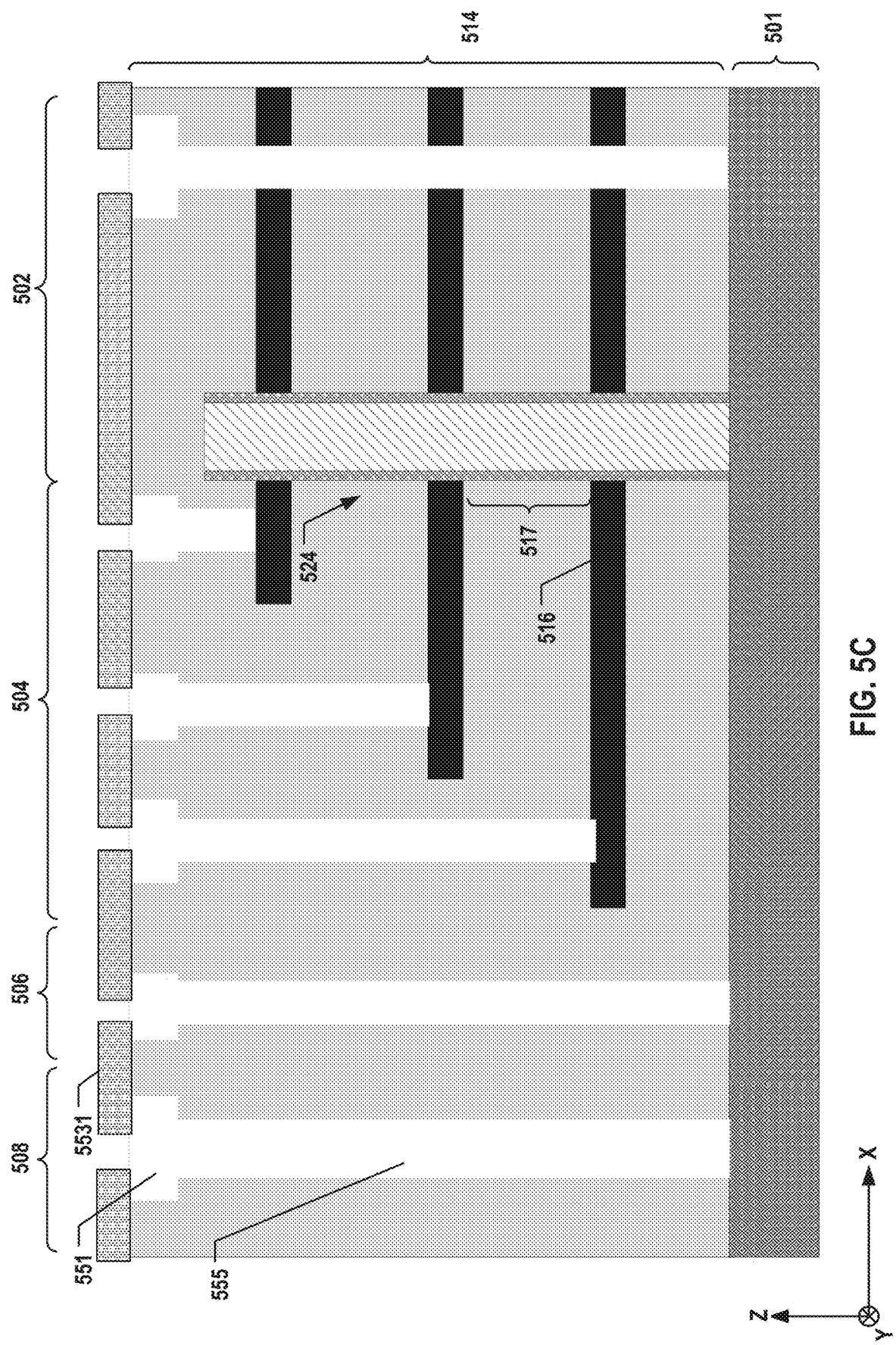
Figure 5D:
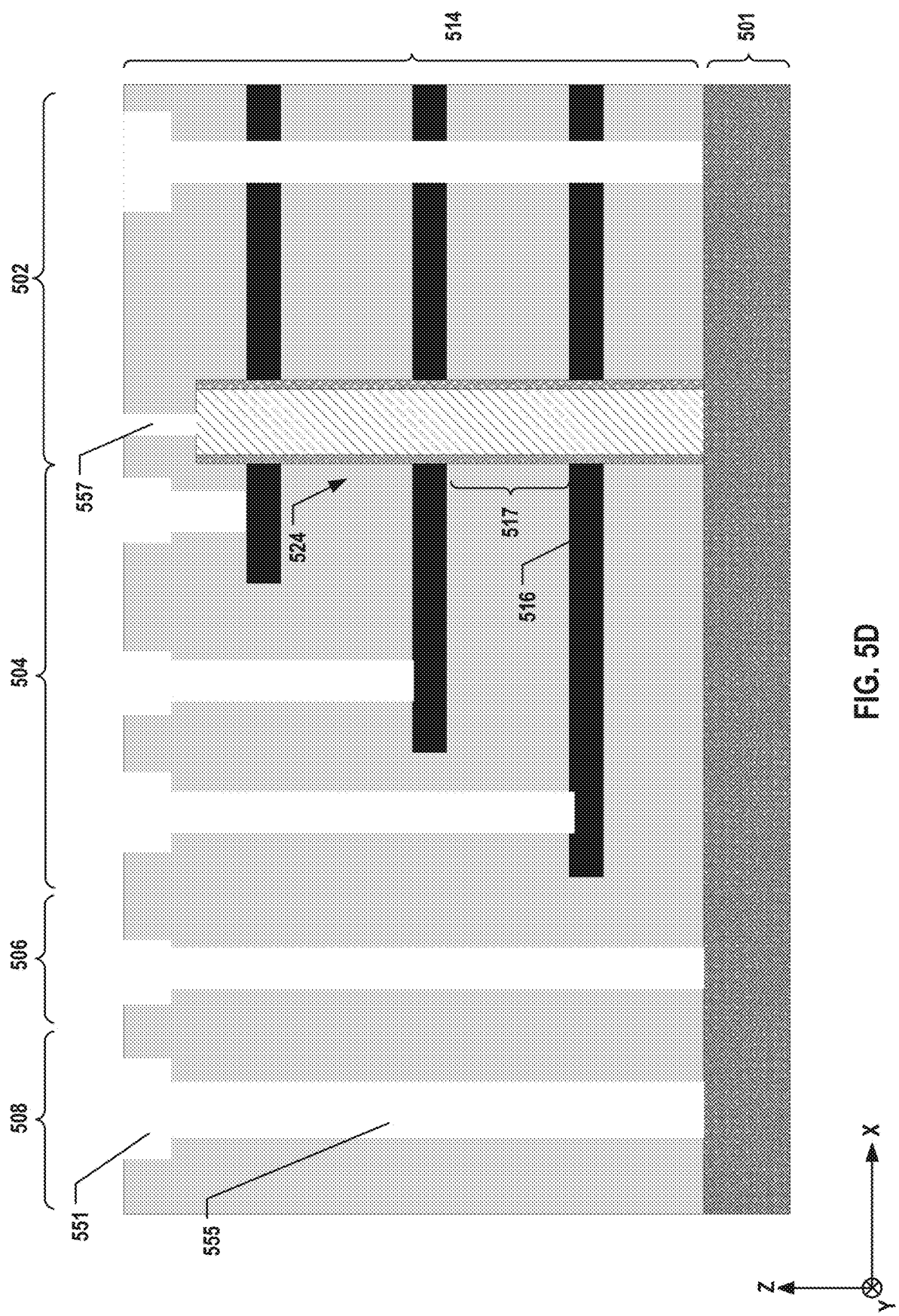
Figure 6A:
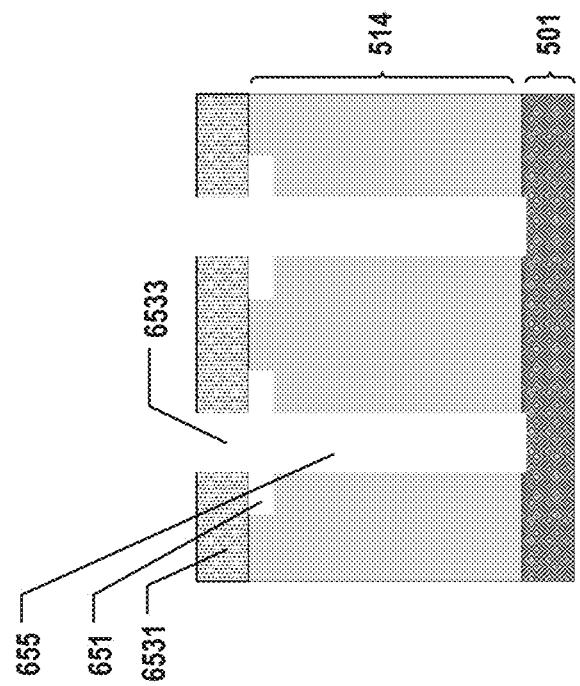
FIGS. 6A-6B illustrate parts of the fabrication process for forming the 3D memory device, according to some aspects of the present disclosure.
Figure 6B:
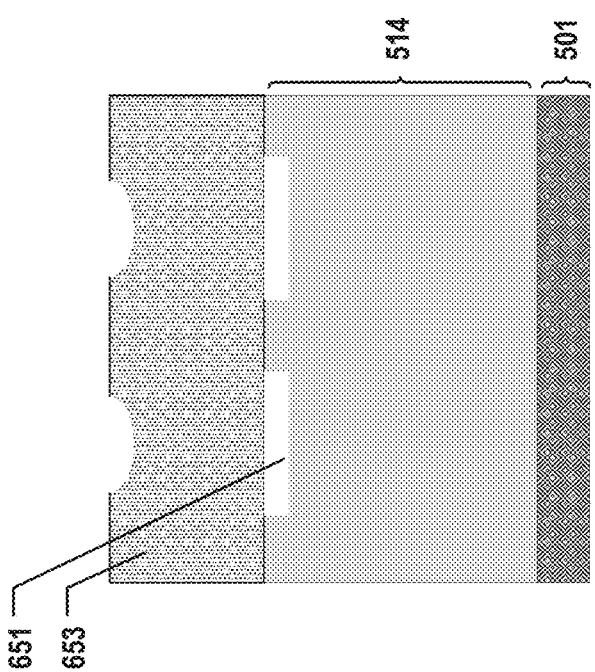
Figure 6D:
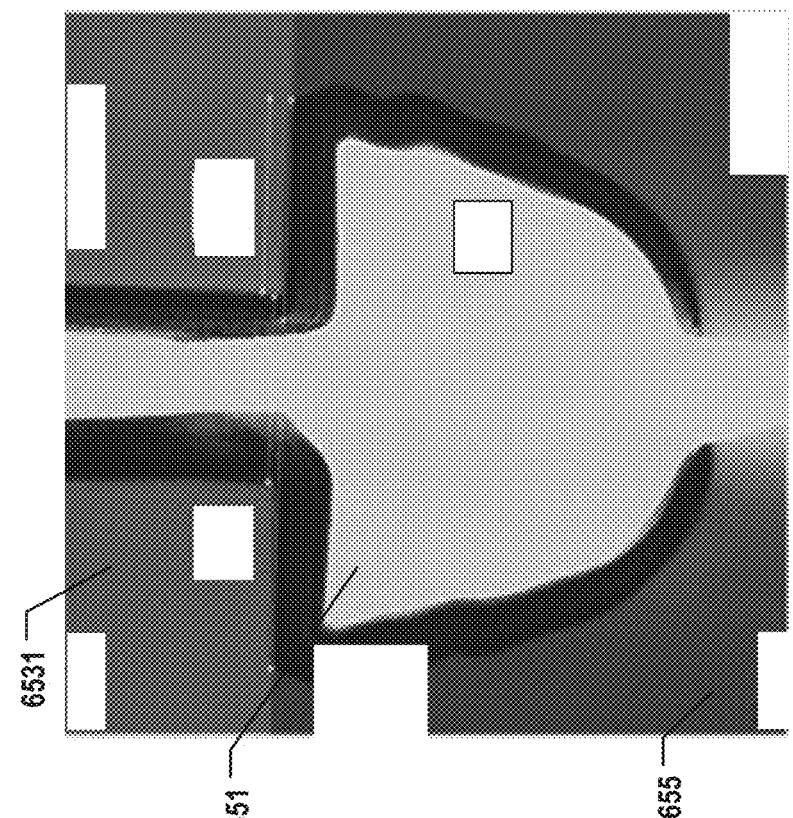
FIGS. 6C-6D illustrate TEM cross-sectional view images showing the parts of the fabrication process for forming the 3D memory device, according to some aspects of the present disclosure.
Figure 6C:
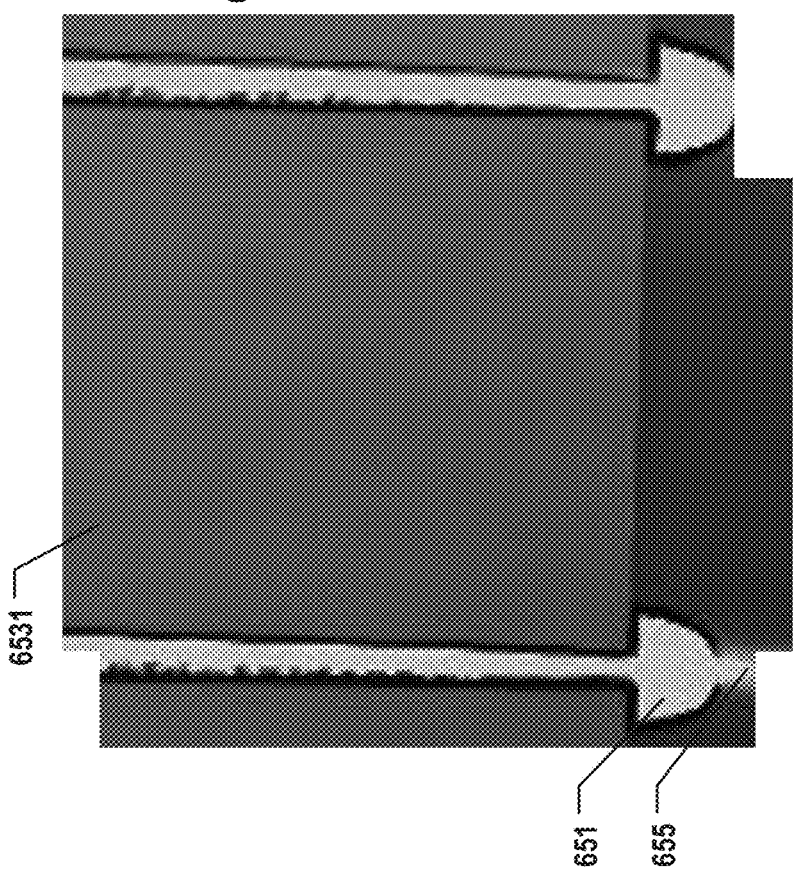
Figure 7:
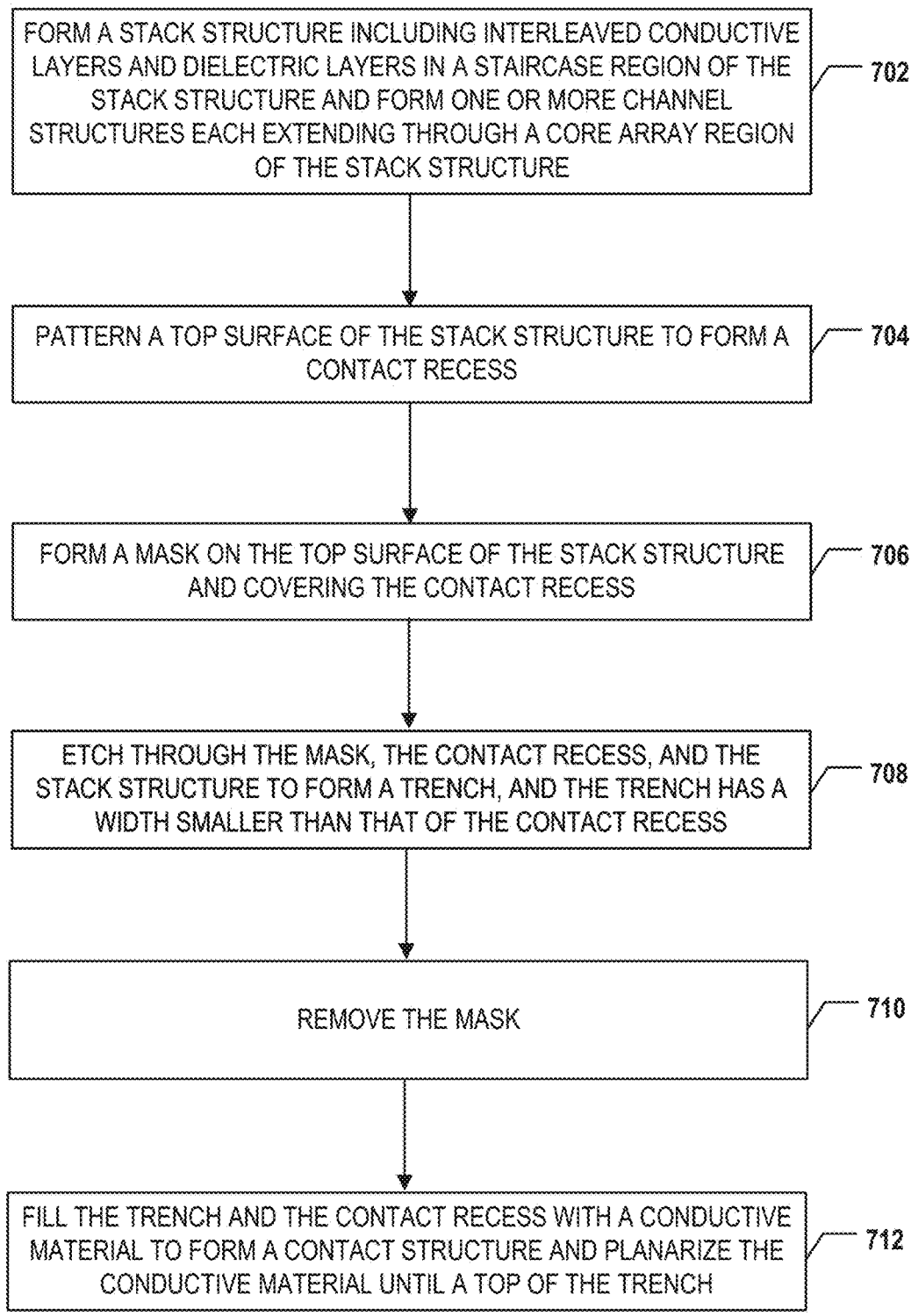
FIG. 7 illustrates a flowchart of a method for forming an exemplary 3D memory device, according to some aspects of the present disclosure.

To form 3D memory device 400 with head portion on each respective contact structures, FIGS. 5A-5D illustrate a fabrication process for forming 3D memory device 400, according to some aspects of the present disclosure. FIGS. 6A-6D illustrate a more detailed fabrication process of FIGS. 5A-5D for forming 3D memory device 400, according to some aspects of the present disclosure. FIG. 7 illustrates a flowchart of a method 700 for forming an exemplary 3D memory device 400, according to some aspects of the present disclosure. It is understood that the operations shown in method 700 are not exhaustive and that other operations can be performed as well before, after, or between any of the illustrated operations. Further, some of the operations may be performed simultaneously, or in a different order than shown in FIG. 7. FIGS. 5A-5D, 6A-6D, and 7 will be described together.

Referring to FIG. 7, method 700 starts at operation 702, in a stack structure including a channel structure in a core array region and interleaved conductive layers and dielectric layers in a staircase region on a substrate. For example, as illustrated in FIG. 5A, a stack structure 514 (corresponding to stack structure 414 in FIG. 4A) is formed on a substrate 501 (corresponding to substrate 401 in FIG. 4A). Stack structure 514 includes a channel structure 524 (corresponding to channel structure 424 in FIG. 4A) formed in a core array region 502 (corresponding to core array region 402 in FIG. 4A) and interleaved conductive layers 516 and dielectric layers 517 (corresponding to interleaved conductive layers 416 and dielectric layers 417 in FIG. 4A) formed in a staircase region 504 (corresponding to staircase region 404 in FIG. 4A). To form channel structure 524 and interleaved conductive layers 516 and dielectric layers 517, a dielectric stack (not shown) including a plurality pairs of a stack sacrificial layer (not shown) and a stack dielectric layer (not shown), together referred to herein as "dielectric layer pairs," is formed on substrate 501. Dielectric stack includes interleaved stack sacrificial layers and stack dielectric layers, according to some embodiments. Stack dielectric layers and stack sacrificial layers can be alternatively deposited on substrate 501 to form dielectric stack. Dielectric stack can be formed by one or more thin film deposition processes, including, but not limited to, chemical vapor deposition (CVD), physical vapor deposition (PVD), atomic layer deposition (ALD), or any combination thereof. As illustrated in FIG. 5A, a staircase structure (not shown) can be formed on the edge of dielectric stack in a staircase region 504 (corresponding to staircase region 404). The staircase structure can be formed by performing a plurality of so-called "trim-etch" cycles to the dielectric layer pairs of dielectric stack toward substrate 501. Next, a channel hole (not shown) is formed extending vertically through the dielectric stack, and a memory film (not shown) and a semiconductor channel (not shown) are sequentially formed along a sidewall of the channel hole. In some embodiments, fabrication processes for forming the channel hole of channel structure 524 include wet etching and/or dry etching, such as deep reactive-ion etching (DRIE). In some embodiments, the channel hole of channel structure 524 extends further through the top portion of substrate 501. Next, the memory film (including a blocking layer, a storage layer, and a tunneling layer) and the semiconductor channel are sequentially formed in this order along sidewalls and the bottom surface of the channel hole. In some embodiments, the memory film is first deposited along the sidewalls and bottom surface of the channel hole, and the semiconductor channel is then deposited over the memory film. The blocking layer, the storage layer, and the tunneling layer can be sequentially deposited in this order using one or more thin film deposition processes, such as ALD, CVD, PVD, any other suitable processes, or any combination thereof, to form the memory film. The semiconductor channel can then be formed by depositing a semiconductor material, such as polysilicon, over the tunneling layer of the memory film using one or more thin film deposition processes, such as ALD, CVD, PVD, any other suitable processes, or any combination thereof. A capping layer (not shown) can be formed in the channel hole and over the semiconductor channel to completely or partially fill the channel hole (e.g., without or with an air gap). A channel plug (not shown) can then be formed in the top portion of the channel hole. Channel structure 524 is thereby formed through the dielectric stack into substrate 501. Next, a slit (not shown) is formed extending vertically through dielectric stack into substrate 501. In some embodiments, fabrication processes for forming the slit include wet etching and/or dry etching, such as DRIE. Next, the dielectric stack is replaced with the stack structure 514 through the slit, for example, using the so-called "gate replacement" process. In some embodiments, to replace the dielectric stack with stack structure 514, the stack sacrificial layers are replaced with stack conductive layers to form interleaved conductive layers 516 and dielectric layers 517 through the slit.

Method 700 proceeds to operation 704, as illustrated in FIG. 7, in which a top surface of the stack structure is patterned to from one or more contact recesses. For example, as illustrated in FIG. 5A, a top surface of stack structure 514 is etched back to form contact recess 551 and a lateral connection recess. In some implementations, patterning the top surface of stack structure 514 to form contact recess 551 and the lateral connection recess includes coating a photoresist layer over the top surface of stack structure 514, exposing the photoresist layer with an ultraviolet (UV) light via a photomask having the desired pattern (e.g., the pattern of contact recess 551 and the lateral connection recess), developing the photoresist layer to form a patterned photoresist layer, and etching via the patterned photoresist layer to form contact recess 551 and the lateral connection recess. In some implementations, one or more contact recesses 551 can be formed in core array region 502, staircase region 504, peripheral region 506 (corresponding to peripheral region 406 in FIG. 4A), or protection region 508 (corresponding to protection region 408 in FIG. 4A). In some implementations, the lateral connection recess can be formed in core array region 502, staircase region 504, or peripheral region 506. Because, in some implementation, the lateral connection structure may not extend vertically (e.g., in the z-direction) through the entire stack structure 414 but only extend through a top portion of stack structure 414, and also the lateral connection structure generally extends laterally (e.g., in the x- or y-direction) to connect word lines in different blocks or different ACSs in the same block, the lateral connection recess can be formed above the interleaved conductive layers and dielectric layers in core array region 502 or staircase region 504 without contacting these layers. However, in some implementations, the lateral connection recess may also extend in the z-direction to expose two of conductive layers 516 which are connected to two respective ACSs in the same block. As such, after depositing the lateral connection structure in the lateral connection recess, two respective ACSs are connected via the lateral connection structure. Contact recess 551 is formed extending vertically through stack structure 514. In some implementations, a depth of contact recess 551 can be, for example, between 150 to 300 nm. A width of contact recess 551 can be, for example, between 240 to 400 nm. Each of contact recesses 551 may have respective width and depth. In some implementations, the fabrication process of forming contact recess 551 includes wet etching and/or dry etching, such as DRIE. In some implementations, the fabrication process of forming contact recess 551 can be the same fabrication process of the lateral connection recess for depositing the lateral connection structure therein that electrically connect between multiple core array regions 502 and staircase region 504 of different blocks. Since, in some implementations, the lateral connection structure may include stair shape or pattern shape extending in the z-direction (e.g., vertical direction) that can reduce the stress of the chip, the patterning of the lateral connection recess can use a same etch mask to form contact recess 551 and in a same etch process (e.g., simultaneous etching to form the lateral connection recess and contact recess 551). This allows to simplify the fabrication process and reduce fabrication cost. Therefore, the depth of contact recess 551 can be the same depth as the lateral connection recess, for example, between 150 to 300 nm. Also, as mentioned above, in some implementations, the lateral connection recess may extend in the z-direction to expose two of conductive layers 516 which are connected to two respective ACSs in the same block. It can be done by etching two portions of the lateral connection recess in the z-direction to expose two of conductive layers 516, and then etching the body portion of the lateral connection recess in the y- or x-direction so as to form a upside down U-shape of the lateral connection recess.

Method 700 proceeds to operation 706, as illustrated in FIG. 7, in which a etch mask is formed on the top surface of the stack structure and covering the contact recess and the lateral connection recess. For example, as illustrated in FIG. 5B, etch mask 553 is formed on the top surface of stack structure 514 and covering contact recess 551 and the lateral connection recess. In some implementations, etch mask 553 includes a photoresist layer. In some implementations, etch mask 553, after being exposed to ultraviolet light, may be partially formed within contact recess 551. In some implementations, as shown in FIG. 6A, etch mask 653 (corresponding to etch mask 553 in FIG. 5B) may cover contact recess 651 (corresponding to contact recess 551 in FIG. 5B) while creating a vacancy in contact recess 651. The portion of etch mask 653 covering the vacancy of contact recess 651 may bend downward or being thinned after being exposed to ultraviolet light. Therefore, by using the thinned or bending portion of etch mask 653, a later etching process can be applied over etch mask 653 via the thinned portion of etch mask 653. In some implementations, the thinned or bending portion of etch mask 653 may be removed by applying another etching process.

Method 700 proceeds to operation 708, as illustrated in FIG. 7, in which the etch mask, the contact recess, and the stack structure are etched through to form a trench, and the trench has a width smaller than that of the contact recess. For example, as illustrated in FIG. 5C, an etching process is applied through etch mask 553, contact recess 551, and stack structure 514 to form one or more trenches 555. The etching process etching through etch mask 553 forms a remaining etch mask 5531. The etching process to form trench 555 includes wet etching and/or dry etching, such as DRIE. In some implementations, each trench 555 is formed by a respective etching process, i.e., using a respective etching solution or etching ions with respective etching time. In some implementations, a feature of etching machine called "end-point detection" can be used such that when etching to a pre-determined specific layer, e.g., a conductive layer, the etching machine will detect specific element of such layer and the etching process will be suspended or stopped. By doing so, the etching process to form trenches 555 can be formed by several etching process with such "end-point feature" of the etching machine. However, it is not limited to such feature, in some implementations, an etch stop layer can formed on respective conductive layers such that each trench 555 can be formed above the respective conductive layers. Each trench 555 has a width smaller than that of the respective contact recess (e.g., contact recess 551). In some implementations, trench 555 may extend through stack structure 514 to substrate 501, to conductive pairs (interleaved conductive layers 516 and dielectric layers 517), or even penetrating through substrate 501. These trenches may be used to form contact structures later. It is noted that the term "trench" used herein is not limited to its shape in the plan view. It can be a slit, a hole, a ring, or any openings with any shapes in the plan view. In some implementations, as shown in FIGS. 6A and 6B, after etch mask 653 is formed to cover contact recess 651 leaving the vacancy in contact recess 651, the portion of etch mask 653 covering over the vacancy of contact recess 651 is bent downward or being thinned after being exposed to ultraviolet light. Next, by using the thinned or bending portion of etch mask 653 or via the trench after removing the thinned or bending portion, the etching process can be applied over etch mask 653 such that the width (e.g., critical dimension) of trench 655 (corresponding to 555 in FIG. 5C) can be smaller than the width of contact recess 651. In some implementations, another patterning process may be applied to etch mask 653 to form mask holes 6533 which are in aligned with the location of contact recesses 651. After the patterning process, the etching process of stack structure 514 can be performed by etching through mask holes 6533 to form trenches 655. As shown in TEM cross-sectional view images in FIGS. 6C-6D, a width of trench 655 is much smaller than that of contact recess 651 with a thick etch mask layer (e.g., remaining etch mask 6531) covering contact recess 651. It is noted that, although the width of contact recess 551 is larger than the width of trench 555, contact recess 551 cannot be too large such that the later deposition process cannot fill the contact recess or the trench conformally. For example, if the width of the contact recess is larger than 450 nm while the width of the trench is less than 250 nm, the deposition of conductive material to fill the trench may be challenging. Therefore, it is better to control the ratio between the width of contact recess and that of the trench to be less than 1.5, for example, between 1.2 and 1.3.

Method 700 proceeds to operation 710, as illustrated in FIG. 7, in which the etch mask is removed. For example, as illustrated in FIG. 5D, remaining etch mask 5531 is removed from the top surface of stack structure 514. In some implementations, the removal of remaining etch mask 5531 includes using a solvent. After removing the etch mask, one or more trenches 555 and one or more contact recesses 551 above the respective trenches are exposed. The lateral connection recess can also be exposed in the same removing the etch mask process. In some implementations, a channel plug hole 557 may also be formed by etching through stack structure 514 to expose a top surface of channel structure 524. Channel plug hole 557 can be done before or after removing the etch mask. In some implementations, a another etch mask can be formed covering contact recesses 551 and the lateral connection recess to protect from etching while leaving the channel plug hole 557 open or to be easily etching through by photolithography.

Method 700 proceeds to operation 712, as illustrated in FIG. 7, in which one or more contact structures are formed by filling a conductive material in the trench and the contact recess. After the deposition of contact structures, for example, as illustrated in FIG. 4A, contact structures 441, 443, 445, and/or 447, with a respective head portion 4411, 4431, 4451, and/or 4471 may be formed within respective trenches 555. Channel plug 444 may also be formed within channel plug hole 557. And the lateral connection structure may also be formed within the lateral connection recess. The deposition of the contact structures 441, 443, 445, and/or 447, within the respective head portion 4411, 4431, 4451, and/or 4471, and the deposition of the lateral connection structure within the lateral connection recess can be simultaneously processed in the same deposition process. In some implementations, channel plug 444 may also be formed within channel plug hole 557 in the same deposition process. In some implementations, the deposition of contact structures includes, but not limited to, CVD, PVD, ALD, or any combination thereof. In some implementations, the deposition of contact structures may include W, Co, Cu, Al, silicides, or any combination thereof. In some implementations, the deposition of contact structures includes a tungsten (W) deposition with tungsten hexafluoride (WF6). In some implementations, ILD layers may be formed in the trenches before forming the conductive layers of the contact structure. In some implementations, spacer 4432 may be formed in a sidewall and/or a bottom of the trench before forming the conductive layers of fourth contact structure 443 to isolate fourth contact structure 443 from contacting conductive layers 416. In some implementations, after deposition of contact structures in the contact recesses and trenches, a chemical mechanical polishing (CMP) or any other suitable planarization process can then be performed to remove excess conductive material on the top surface of stack structure 414, leaving one or more contact structures extending vertically through stack structure 414.

Figure 8:
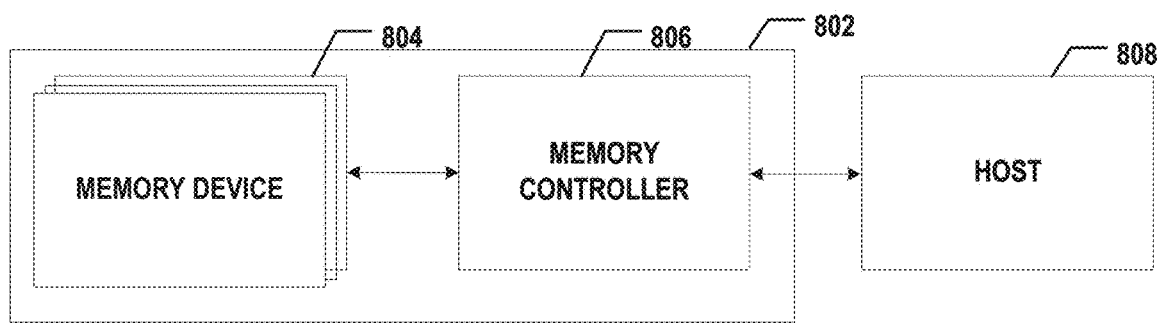
FIG. 8 illustrates a block diagram of an exemplary system having a 3D memory device, according to some aspects of the present disclosure.

FIG. 8 illustrates a block diagram of a system 800 having a memory device, according to some aspects of the present disclosure. System 800 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 8, system 800 can include a host 808 and a memory system 802 having one or more memory devices 804 and a memory controller 806. Host 808 can be a processor of an electronic device, such as a central processing unit (CPU), or a system-on-chip (SoC), such as an application processor (AP). Host 808 can be configured to send or receive the data to or from memory devices 804.

Memory devices 804 can be any memory devices disclosed herein, such as memory devices 100 or 400. In some implementations, each memory device 804 includes a 3D memory device, as described above in detail.

Memory controller 806 is coupled to memory device 804 and host 808 and is configured to control memory device 804, according to some implementations. Memory controller 806 can manage the data stored in memory device 804 and communicate with host 808. In some implementations, memory controller 806 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 806 is designed for operating in a high duty-cycle environment SSDs or embedded multi-media-cards (eMMCs) used as data storage for mobile devices, such as smartphones, tablets, laptop computers, etc., and enterprise storage arrays. Memory controller 806 can be configured to control operations of memory device 804, such as read, erase, and program operations. Memory controller 806 can also be configured to manage various functions with respect to the data stored or to be stored in memory device 804 including, but not limited to bad-block management, garbage collection, logical-to-physical address conversion, wear leveling, etc. In some implementations, memory controller 806 is further configured to process error correction codes (ECCs) with respect to the data read from or written to memory device 804. Any other suitable functions may be performed by memory controller 806 as well, for example, formatting memory device 804. Memory controller 806 can communicate with an external device (e.g., host 808) according to a particular communication protocol. For example, memory controller 806 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figures 9A, 9B:
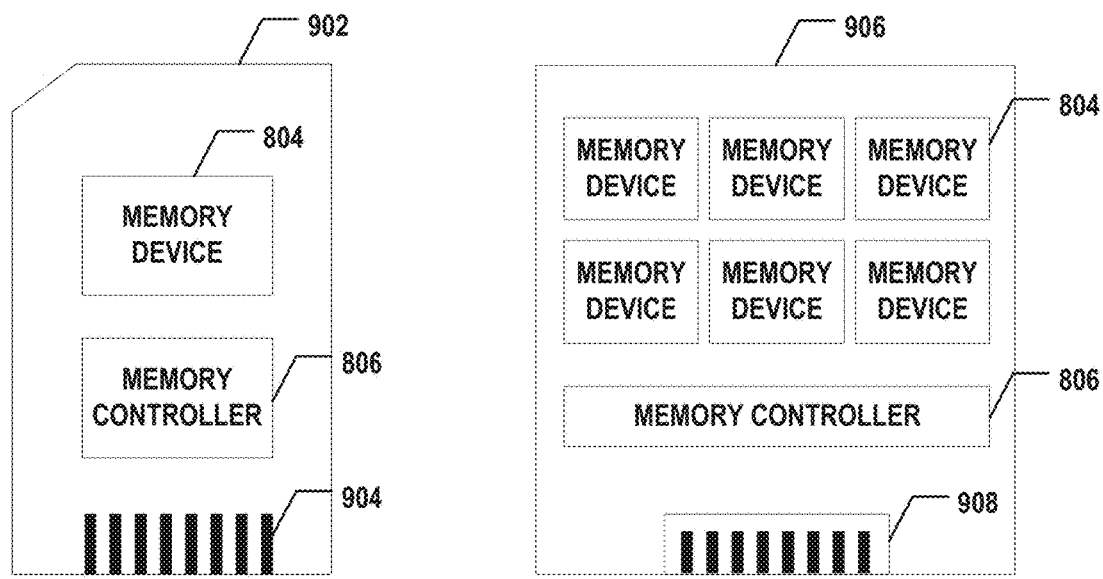
FIG. 9A illustrates a diagram of an exemplary memory card having a 3D memory device, according to some aspects of the present disclosure.
FIG. 9B illustrates a diagram of an exemplary solid-state drive (SSD) having a 3D memory device, according to some aspects of the present disclosure.

Memory controller 806 and one or more memory devices 804 can be integrated into various types of storage devices, for example, be included in the same package, such as a universal Flash storage (UFS) package or an eMMC package. That is, memory system 802 can be implemented and packaged into different types of end electronic products. In one example as shown in FIG. 9A, memory controller 806 and a single memory device 804 may be integrated into a memory card 902. Memory card 902 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 902 can further include a memory card connector 904 coupling memory card 902 with a host (e.g., host 808 in FIG. 8). In another example as shown in FIG. 9B, memory controller 806 and multiple memory devices 804 may be integrated into an SSD 906. SSD 906 can further include an SSD connector 908 coupling SSD 906 with a host (e.g., host 808 in FIG. 8). In some implementations, the storage capacity and/or the operation speed of SSD 906 is greater than those of memory card 902.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
    a stack structure comprising interleaved conductive layers and dielectric layers and having a core array region and a staircase region; and
    one or more first contact structures each extending in the staircase region of the stack structure and in contact with one of the conductive layers of the interleaved conductive layers and dielectric layers, wherein each of the one or more first contact structures comprises a head portion and a body portion, the head portion being located in the stack structure, and a width of the head portion of the respective first contact structures is larger than that of the body portion of the respective first contact structures.

2. The 3D memory device of claim 1, further comprising: one or more channel structures each extending in the stack structure in the core array region.

3. The 3D memory device of claim 1, further comprising:
    one or more second contact structure each extending in the core array region of the stack structure and in contact with a substrate.

4. The 3D memory device of claim 1, further comprising:
    one or more fourth contact structures each extending in a protection region and at least partially surrounding the core array region and the staircase region in a plan view, wherein each of the one or more fourth contact structures comprises a rectangle shape and has four sides connected to enclose the core array region and the staircase region in the plan view.

5. The 3D memory device of claim 1, wherein the width of the head portion is between 240 and 400 nm, and the width of the respective body portion is between 200 and 300 nm.

6. The 3D memory device of claim 1, wherein a material of each of the one or more first contact structures comprises tungsten (W).

7. The 3D memory device of claim 1, further comprising:
a lateral connection structure extending in the stack structure, wherein a depth of the head portion is the same as that of the lateral connection structure.

8. The 3D memory device of claim 3, further comprising:
a third contact structure extending in a peripheral region outside the core array region and the staircase region and in contact with the substrate.

9. A three-dimensional (3D) memory device, comprising:
a stack structure comprising interleaved conductive layers and dielectric layers and having a core array region and a staircase region; and
one or more first contact structures each extending in the staircase region of the stack structure and in contact with one of the conductive layers of the interleaved conductive layers and dielectric layers, wherein each of the one or more first contact structures comprises a head portion and a body portion, and a width of the head portion of the respective first contact structures is larger than that of the body portion of the respective first contact structures,
wherein the width of the head portion is between 240 and 400 nm, and the width of the respective body portion is between 200 and 300 nm.

10. The 3D memory device of claim 9, further comprising: one or more channel structures each extending in the stack structure in the core array region.

11. The 3D memory device of claim 9, further comprising:
one or more second contact structure each extending in the core array region of the stack structure and in contact with a substrate.

12. The 3D memory device of claim 9, further comprising:
one or more fourth contact structures each extending in a plan view, wherein each of the one or more fourth contact structures comprises a rectangle shape and has four sides connected to enclose the core array region and the staircase region in the plan view.

13. The 3D memory device of claim 9, wherein a material of each of the one or more first contact structures comprises tungsten (W).

14. The 3D memory device of claim 9, further comprising:
a lateral connection structure extending in the stack structure, wherein a depth of the head portion is the same as that of the lateral connection structure.

15. The 3D memory device of claim 11, further comprising:
a third contact structure extending in a peripheral region outside the core array region and the staircase region and in contact with the substrate.

16. A three-dimensional (3D) memory device, comprising:
a stack structure comprising interleaved conductive layers and dielectric layers and having a core array region and a staircase region;
one or more first contact structures each extending in the staircase region of the stack structure and in contact with one of the conductive layers of the interleaved conductive layers and dielectric layers, wherein each of the one or more first contact structures comprises a head portion and a body portion, and a width of the head portion of the respective first contact structures is larger than that of the body portion of the respective first contact structures; and
a lateral connection structure extending in the stack structure, wherein a depth of the head portion is the same as that of the lateral connection structure.

17. The 3D memory device of claim 16, further comprising: one or more channel structures each extending in the stack structure in the core array region.

18. The 3D memory device of claim 16, further comprising:
one or more second contact structure each extending in the core array region of the stack structure and in contact with a substrate.

19. The 3D memory device of claim 16, further comprising:
one or more fourth contact structures each extending in a plan view, wherein each of the one or more fourth contact structures comprises a rectangle shape and has four sides connected to enclose the core array region and the staircase region in the plan view.

20. The 3D memory device of claim 18, further comprising:
a third contact structure extending in a peripheral region outside the core array region and the staircase region and in contact with the substrate.

* * * * *